(12) United States Patent
Suda

(10) Patent No.: US 6,441,441 B1
(45) Date of Patent: *Aug. 27, 2002

(54) SEMICONDUCTOR DEVICE AND METHOD OF MANUFACTURING THE SAME

(75) Inventor: Kakutaro Suda, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/762,966

(22) Filed: Dec. 10, 1996

(30) Foreign Application Priority Data

Jun. 7, 1996 (JP) .............................. 8-146342

(51) Int. Cl.[7] .............................................. H01L 29/76
(52) U.S. Cl. ........................ 257/370; 257/378; 257/412
(58) Field of Search ................................ 257/412, 370, 257/378, 755

(56) References Cited

U.S. PATENT DOCUMENTS

| | | | | |
|---|---|---|---|---|
| 4,329,706 A | * | 5/1982 | Crowder et al. | 257/313 |
| 4,542,580 A | | 9/1985 | Delivorias | 29/590 |
| 4,752,589 A | | 6/1988 | Schaber | 437/31 |
| 4,755,865 A | * | 7/1988 | Wilson et al. | 257/754 |
| 4,774,197 A | * | 9/1988 | Haddad et al. | 438/585 |
| 4,931,407 A | | 6/1990 | Maeda et al. | 437/45 |
| 5,057,894 A | * | 10/1991 | Ikeda et al. | 257/370 |
| 5,089,862 A | * | 2/1992 | Warner, Jr. et al. | 257/24 |
| 5,134,454 A | * | 7/1992 | Neudeck et al. | 257/587 |
| 5,238,850 A | | 8/1993 | Matsunaga et al. | 437/40 |
| 5,439,833 A | * | 8/1995 | Hebert et al. | 257/378 |
| 5,710,453 A | * | 1/1998 | Bryant | 257/412 |
| 5,759,883 A | * | 6/1998 | Kinoshita | 257/378 |

FOREIGN PATENT DOCUMENTS

| | | | | |
|---|---|---|---|---|
| JP | 62-98663 | | 5/1987 | |
| JP | 6331156 | * | 2/1988 | 257/378 |
| JP | 63246862 | * | 10/1988 | 257/378 |
| JP | 63-301556 | | 12/1988 | |
| JP | 4-157766 | | 5/1992 | |

OTHER PUBLICATIONS

IEEE Electron Device Letters, vol. 8, #2, pp. 58–60 by Haddad et al. Feb. 1987.*

IEEE Transactions on Electron Devices, vol. 42, No. 12, pp. 2163–2169 by Yang et al. Dec. 1995, 257/412.*

* cited by examiner

*Primary Examiner*—Mark V. Prenty
(74) *Attorney, Agent, or Firm*—Oblon, Spivak, McClelland, Maier & Neustadt, P.C.

(57) ABSTRACT

In a semiconductor device having a bipolar transistor and a MOS transistor on a same semiconductor substrate, a gate electrode of MOS transistor is formed of a first gate electrode layer on a gate oxide film and a second gate electrode layer formed on the first gate electrode layer. Nitrogen is introduced into the first gate electrode layer, and is aggregated around the interface with the gate oxide film. Arsenic is implanted into a second gate electrode layer, and diffused into the second gate electrode layer. An emitter electrode of a bipolar transistor is formed of the same layer with the second gate electrode layer, but nitrogen is not introduced.

14 Claims, 25 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and more particularly to a bipolar complementary metal-oxide semiconductor device (hereinafter referred to as a "Bi-CMOS device") and a method of manufacturing the same.

2. Description of the Background Art

FIG. 23 is a cross-sectional structural view of a conventional Bi-CMOS device. As shown in the figure, the conventional Bi-CMOS device is constructed so that an NPN bipolar transistor, a P-channel MOS transistor, and an N-channel MOS transistor are formed on a P-type semiconductor substrate 1.

The NPN bipolar transistor includes a heavily doped N-type buried layer 2 formed in the lightly doped P-type semiconductor substrate 1, a lightly doped N-type collector layer 3, a heavily doped N-type contact collector layer 4, a P-type isolating layer 7, a heavily doped P-type outer base layer 8, a moderately doped P-type base layer 9, a heavily doped N-type emitter layer 10, a base electrode 200, and an emitter electrode 301. The NPN bipolar transistor further includes an element isolating oxide film 101, an oxide film 104, a thermal oxide film 105, a sidewall oxide film 106, and an oxide film 107. The emitter electrode 301 is formed with a polycrystalline silicon film in which arsenic is generally introduced as an N-type impurity.

The P-channel MOS transistor includes a lightly doped N-type well layer 5 formed in the P-type semiconductor substrate 1, a heavily doped P-type source/drain layer 11, a gate oxide film 102, an oxide film 107, and a gate electrode 401. Here, the gate electrode 401 is formed with upper and lower polycrystalline silicon films 502 and 501 in which arsenic is generally introduced as an N-type impurity. The upper polycrystalline silicon film 502 is the same film as the emitter electrode 301 of the NPN bipolar transistor.

The N-channel MOS transistor includes a lightly doped P-type well layer 6 formed in the P-type semiconductor substrate 1, a heavily doped N-type source/drain layer 12, a gate oxide film 102, an oxide film 107, and a gate electrode 402. Here, the gate electrode 402 is formed with the same upper and lower polycrystalline silicon films 502 and 501 as the gate electrode 401 of the P-channel MOS transistor.

The NPN bipolar, P-channel MOS, and N-channel MOS transistors are isolated from one another by the element isolating oxide films 101, and each transistor surface is covered with an oxide film 108, in which contact holes 601, 602, 603, 606, and 607 and a metal wire 700 are formed.

Next, FIG. 24 is a cross-sectional structural view showing one step of the method of manufacturing the conventional Bi-CMOS device. The method of manufacturing the conventional Bi-CMOS device will be described with reference to FIGS. 23 and 24.

In the conventional manufacturing method, a heavily doped N-type buried layer 2 is first formed in the NPN bipolar transistor formation region of the lightly doped P-type semiconductor substrate 1, and then a lightly doped N-type epitaxial layer 3 is grown on the entire surface. Thereafter, the element isolating oxide film 101 is formed on each element isolating region and across the collector and base layer of the bipolar transistor. Subsequently, the heavily doped N-type collector layer 4 of the NPN bipolar transistor is formed on a collector contact portion, and the lightly doped N-type well layer S of the P-channel MOS transistor, and the lightly doped P-type well layer 6 of the N-channel MOS transistor are formed, respectively. Furthermore, a moderately doped P-type isolating layer 7 is formed in the N-type epitaxial layer 3 and between the N-type epitaxial layer 3 and the N-type well layer 5. Note that the N-type epitaxial layer 3 becomes the N-type collector layer 3 of the NPN bipolar transistor.

Next, a gate oxide film 102 is formed on each surface of the N-type collector layer 3, the N-type collector contact layer 4, the N-type well layer 5, and the P-type well layer 6. Further, a lower polycrystalline silicon film 501 is formed on the entire surface of the gate oxide film 102.

Next, the lower polycrystalline silicon film 501 and the gate oxide film 102 on the surface of the N-type collector 3 are removed, and a polycrystalline silicon film 500 is formed on the entire surface. Then, boron ions are implanted into the polycrystalline silicon film 500 so that it becomes a P-type.

Next, an oxide film 104 is formed on the entire surface of the polycrystalline silicon film 500. The oxide film 104 and the polycrystalline silicon film 500 are removed in sequence, while the films 104 and 500, deposited on the outer base layer formation region of the NPN bipolar transistor and on a portion of the element isolating oxide film 101, are not removed. Next, a thermal oxide film 105 is formed on the surface of the N-type collector 3 from which the polycrystalline silicon film 500 has been removed, and at the same time, a heavily doped P-type outer base layer 8 is formed by thermal diffusion of boron from the polycrystalline silicon film 500 into the N-type collector layer 3. Here, the polycrystalline silicon film 500 becomes the base electrode 200 of the NPN bipolar transistor. Further, boron ions are implanted through the thermal oxide film 105 to form a moderately doped P-type base layer 9 on the upper portion of the N-type collector layer 3.

Next, an oxide film is deposited on the entire surface, and side-wall oxide films 106 are formed on side surfaces of the base electrode 200 and the oxide film 104 by etching back the deposited oxide film. At this time, the thermal oxide film 105 is removed by over-etching.

Next, an upper polycrystalline silicon film 502 is formed on the entire surface, as shown in FIG. 24, and arsenic ions are implanted into the upper polycrystalline silicon film 502 and then annealing is performed. Then, arsenic is diffused from the upper polycrystalline silicon film 502 into the upper portion of the P-type base layer 9 to form a heavily doped N-type emitter 10. Simultaneously, arsenic is diffused into the lower polycrystalline silicon film 501 so that it becomes a N-type.

Furthermore, an oxide film 107 is deposited over the entire surface of the upper polycrystalline silicon film 502. As shown in FIG. 23, the oxide film 107, the upper polycrystalline silicon film 502, and the lower polycrystalline silicon film 501 are sequentially removed, while those on the emitter electrode formation region of the NPN bipolar transistor and the gate electrode formation regions of the MOS transistors are not removed. In this way, the emitter electrode 301, consisting of the upper polycrystalline silicon film 502, and the gate electrodes 401 and 402, consisting of the upper and lower polycrystalline silicon films 502 and 501, are formed. During these processes, the gate oxide film 102 serves as a protective film for each surface of the N-type collector contact layer 4, the N-type well layer 5, and the P-type well layer 6.

Next, the NPN bipolar transistor and the N-channel MOS transistor are covered with a photoresist film (not shown), and boron ions are implanted through the gate oxide film 102 to form a heavily doped P-type source/drain layer 11 on the upper portion of the N-type well layer 5, as shown in FIG. 23. When the ion implantation is performed, the oxide film 107 serves as a mask for the gate electrode 401. Next, the NPN bipolar transistor and the P-channel MOS transistor are covered with a photoresist film (not shown), and arsenic ions are implanted through the gate oxide film 102 to form a heavily doped N-type source/drain layer 12 on the upper portion of the P-type well layer 6. When the ion implantation is performed, the oxide film 107 serves as a mask for the gate electrode 402. Further, the P-type source/drain layer 11 and the N-type source/drain layer 12 are annealed and activated.

Thereafter, an oxide film 108 is deposited on the entire surface, and contact holes 601 through 609 are formed on the N-type collector contact layer 4, the base electrode 200, the emitter electrode 301, the N-type well layer 5, the P-type well layer 6, the P-type source/drain layer 11, the N-type source/drain layer 12, the gate electrode 401 of the P-channel MOS transistor, and the gate electrode 402 of the N-channel MOS transistor, respectively. An appropriate metal lead 700 is formed, and a device structure such as shown in FIG. 23, is obtained. Note that the contact holes 604, 605, 608, and 609 on the N-type well layer 5, the P-type well layer 6, and the gate electrodes 401 and 402 are formed on the regions not appearing in FIG. 23.

The foregoing is the structure of the conventional Bi-CMOS device and the method of manufacturing the same. Next, problems with the conventional Bi-CMOS device will be described.

First, the problems with the structure of the conventional Bi-CMOS device will be described.

FIG. 25 is a diagram showing the concentration distribution of arsenic along the A–A' line of FIG. 23. The gate electrodes 401 and 402 of the N-channel and P-channel MOS transistors are each formed by the upper and lower polycrystalline silicon films 502 and 501 which contain arsenic. In the case where a polycrystalline silicon film containing arsenic is used in a gate electrode, there will be the possibility that arsenic will aggregate, as shown in FIG. 25, near the interface between the polycrystalline silicon film and the oxide film, thereby reducing the life of the gate oxide film.

For the aforementioned problem, an attempt has been made to suppress aggregation of arsenic by introducing nitrogen into the polycrystalline silicon film of the gate electrode and aggregating nitrogen near the interface between the polycrystalline silicon film and the gate oxide film. However, in this method the upper polycrystalline silicon films 502 of the gate electrodes 401 and 402 are the same film as the emitter electrode 301 of the NPN bipolar transistor. Therefore, if nitrogen is introduced into the gate electrodes 401 and 402, it will also be introduced into the emitter electrode 301. The nitrogen introduced into the emitter electrode 301 will give rise to a new problem in that it will aggregate near the interface between the emitter electrode 301 and the N-type emitter layer 10 and reduce the current amplification factor of the NPN bipolar transistor.

In addition, in the conventional Bi-CMOS device, the emitter electrode 301 and the gate electrodes 401 and 402 are formed with a polycrystalline silicon film, so the electrical resistance of each electrode is high and the loss of the consumption power is large.

Next, the problems with the method of manufacturing the conventional Bi-CMOS device will be described.

A first problem is as follows. In the process shown in FIG. 24, when arsenic ions are implanted into the upper polycrystalline silicon film 502, the implantation energy is normally set so that the arsenic ions do not reach the gate oxide film 102. However, the crystal grains of the upper and lower polycrystalline silicon films 502 and 501 have an arbitrary crystal orientation. Therefore, where the crystal orientation matches the implantation direction of arsenic ions, there are some cases where the arsenic ions reach the gate oxide film 102 or the well layer due to the channeling phenomenon where arsenic ions go down to a deeper position without colliding with crystal atoms. Thus, the problem is that the arsenic ions will cause damage to the atomic coupling of the gate oxide film 102 and induce a deterioration in the film quality.

A secondary problem will be described next. Generally, in the thermal diffusion of the impurities in the polycrystalline silicon film, high-speed diffusion takes place along the grain boundary. In the process shown in FIG. 24, arsenic ions are introduced into the upper polycrystalline silicon film 502, and then diffused from the upper polycrystalline silicon film 502 into the lower polycrystalline silicon film 501 to turn it to an N-type. Afterwards, the film 502 is annealed. Here, a possible problem exists that arsenic will reach the interface between the lower polycrystalline silicon film 501 and the gate oxide film 102, due to the high-speed diffusion along the grain boundary, and then aggregate near the interface. Thus the life of the gate oxide film will be reduced. Note that the aforementioned first and secondary problems also arise in the case where an N-type dopant other than arsenic, such as phosphorus, is used.

SUMMARY OF THE INVENTION

The present invention has been made in order to solve the aforementioned problems found in the conventional Bi-CMOS device.

The object of the present invention is to provide a semiconductor device, having a bipolar transistor and a MOS transistor on the same semiconductor substrate, and a manufacturing method thereof, which can prevent a deterioration in the film quality of a gate oxide film and prevent a reduction in the life of the gate oxide film.

According to one aspect of the present invention, a semiconductor device comprises at least one bipolar transistor and at least one metal-oxide semiconductor (MOS) transistor on a semiconductor substrate. The MOS transistor includes a gate oxide film and a gate electrode, and the gate electrode is comprised of a first electrode layer and a second electrode layer formed on said first electrode layer. The first electrode layer is in contact with said gate oxide film, and contains nitrogen aggregated around an interface with said gate oxide film. Further, the bipolar transistor includes an emitter electrode not containing nitrogen, and has a same film thickness as said second gate electrode layer of said MOS transistor.

In another aspect of the present invention, in the semiconductor device, a high-melting-point metal film or a silicide film of a high-melting-point metal is formed on said gate electrode of said MOS transistor and on said emitter electrode of said bipolar transistor, respectively.

In another aspect of the present invention, in the semiconductor device, said bipolar transistor is an NPN type, having an N-type emitter electrode, and a plurality of said MOS transistors that are a combination of complementary metal-oxide semiconductor (CMOS) transistors composed of a P-channel MOS type, having an N-type gate electrode, and an N-channel MOS type, having an N-type gate electrode.

In another aspect of the present invention, in the semiconductor device, said bipolar transistor is an NPN type having an N-type emitter electrode, and a plurality of said MOS transistors that are a combination of complementary metal-oxide semiconductor (CMOS) transistors composed of a P-channel MOS type, having a P-type gate electrode, and an N-channel MOS type having an N-type gate electrode.

In another aspect of the present invention, in the semiconductor device, a plurality of said bipolar transistors are a combination of an NPN type having an N-type emitter electrode and an PNP type having a P-type emitter electrode.

According to another aspect of the present invention, in a method of manufacturing a semiconductor device having a bipolar transistor and a MOS transistor on a semiconductor substrate, a gate oxide film is formed on a region of said semiconductor substrate for making a MOS transistor. A polycrystalline silicon film is formed and nitrogen is introduced into said polycrystalline silicon film to make a first gate electrode layer on said gate oxide film. An amorphous silicon film is formed on said polycrystalline silicon film to make a second gate electrode layer of said MOS transistor, and concurrently the amorphous silicon film is formed to make an emitter electrode on an emitter layer formation region of said semiconductor substrate for making a bipolar transistor. Then, impurities are implanted into said amorphous silicon film. Further, the nitrogen is aggregated around the interface between said polycrystalline silicon film and said gate oxide film by thermal treatment.

According to another aspect of the present invention, in a method of manufacturing a semiconductor device having a bipolar transistor and a MOS transistor on a semiconductor substrate, a gate oxide film is formed on a region of said semiconductor substrate for making a MOS transistor. A polycrystalline silicon film containing nitrogen is formed to make a first gate electrode layer on said gate oxide film for making a MOS transistor. An amorphous silicon film is formed on said polycrystalline silicon film to make a second gate electrode layer of said MOS transistor, and concurrently the amorphous silicon film is formed to make an emitter electrode on an emitter layer formation region of said semiconductor substrate. Then, impurities are implanted into said amorphous silicon film. Further, said nitrogen is aggregated around the interface between said polycrystalline silicon film and said gate oxide film by thermal treatment.

According to another aspect of the present invention, in a method of manufacturing a semiconductor device having a bipolar transistor and a MOS transistor on a semiconductor substrate, a gate oxide film is formed on a region of said semiconductor substrate for making a MOS transistor. A first polycrystalline silicon film is formed to make a first gate electrode layer on said gate oxide film. A second polycrystalline silicon film is formed on said first polycrystalline silicon film to make a second gate electrode layer of said MOS transistor, and concurrently the second polycrystalline silicon film is formed to make an emitter electrode on an emitter layer formation region of said semiconductor substrate for making a bipolar transistor. Then, nitrogen is implanted into said second polycrystalline silicon film, thereby an amorphous layer is formed in said second polycrystalline silicon film. Then, impurities are implanted into said second polycrystalline silicon film to a depth shallower than said amorphous layer. Further, said impurities and nitrogen are diffused from said second polycrystalline silicon film into said first polycrystalline silicon film, and said nitrogen is aggregated around the interface between said first polycrystalline silicon film and said gate oxide film by thermal treatment.

According to another aspect of the present invention, in a method of manufacturing a semiconductor device having a bipolar transistor and a MOS transistor on a semiconductor substrate, a gate oxide film is formed on a region of said semiconductor substrate for making a MOS transistor. A polycrystalline silicon film is formed to make a first gate electrode layer on said gate oxide film. An amorphous silicon film is formed on said polycrystalline silicon film to make a second gate electrode layer of said MOS transistor, and concurrently the amorphous silicon film is formed to make an emitter electrode on an emitter layer formation region of said semiconductor substrate for making a bipolar transistor. Then, nitrogen is implanted into said amorphous silicon film and then impurities are implanted into said amorphous silicon film. Further, said impurities and nitrogen are diffused from said amorphous silicon film into said polycrystalline silicon film, and said nitrogen is aggregated around the interface between said polycrystalline silicon film and said gate oxide film by thermal treatment.

According to another aspect of the present invention, a semiconductor device comprises at least one bipolar transistor and at least one metal-oxide semiconductor (MOS) transistor on a semiconductor substrate. The MOS transistor includes a gate electrode formed of a monocrystalline silicon film. The bipolar transistor includes an emitter electrode formed of a monocrystalline silicon film thinner than said monocrystalline silicon film of said gate electrode of said MOS transistor.

In another aspect of the present invention, in the semiconductor device, a high-melting-point metal film or a silicide film of a high-melting-point metal is formed on said gate electrode of said MOS transistor and on said emitter electrode of said bipolar transistor, respectively.

In another aspect of the present invention, in the semiconductor device, said bipolar transistor is an NPN type having an N-type emitter electrode, and a plurality of said MOS transistors that are a combination of complementary metal-oxide semiconductor (CMOS) transistors composed of a P-channel MOS type having an N-type gate electrode and an N-channel MOS type having an N-type gate electrode.

In another aspect of the present invention, in the semiconductor device, said bipolar transistor is an NPN type having an N-type emitter electrode, and a plurality of said MOS transistors that are a combination of complementary metal-oxide semiconductor (CMOS) transistors composed of a P-channel MOS type having a P-type gate electrode and an N-channel MOS type having an N-type gate electrode.

In another aspect of the present invention, in the semiconductor device, a plurality of said bipolar transistors are a combination of an NPN type having an N-type emitter electrode and an PNP type having a P-type emitter electrode.

According to another aspect of the present invention, in a method of manufacturing a semiconductor device having a bipolar transistor and a MOS transistor on a semiconductor substrate, a gate oxide film is formed on a region of said semiconductor substrate for making a MOS transistor. A first amorphous silicon film is formed to make a first gate electrode layer on said gate oxide film for making a MOS transistor, and said first amorphous silicon film is crystallized by thermal treatment to transform it into a first monocrystalline silicon film. A second amorphous silicon film is formed on said first monocrystalline silicon film to make a second gate electrode layer of said MOS transistor, and concurrently the second amorphous silicon film is formed to make an emitter electrode on an emitter layer formation region of said semiconductor substrate for making a bipolar transistor. Then, impurities are implanted into said second amorphous silicon film. Further, said impurities are diffused from said second amorphous silicon film into said first monocrystalline silicon film, and said second amorphous silicon film is crystallized to transform it into a second monocrystalline silicon film by thermal treatment.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
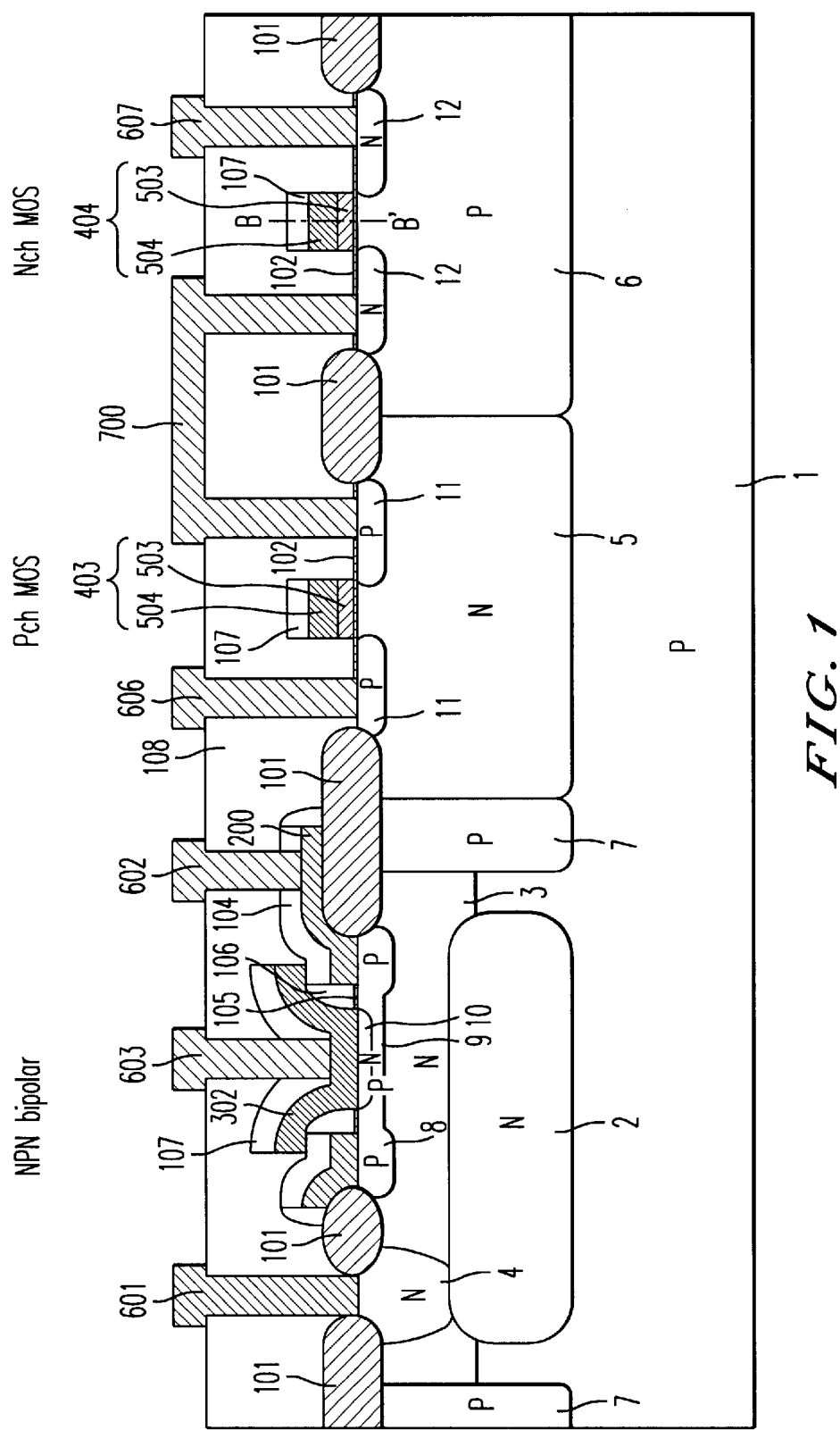
FIG. 1 illustrates a cross-sectional structure of a Bi-CMOS device according to a first embodiment of the present invention.

Referring now to the drawings, wherein like reference numerals designate identical or corresponding parts throughout the views, descriptions will be made of embodiments of a semiconductor device and a method of manufacturing the same according to the present invention.

First Embodiment

Figure 2:
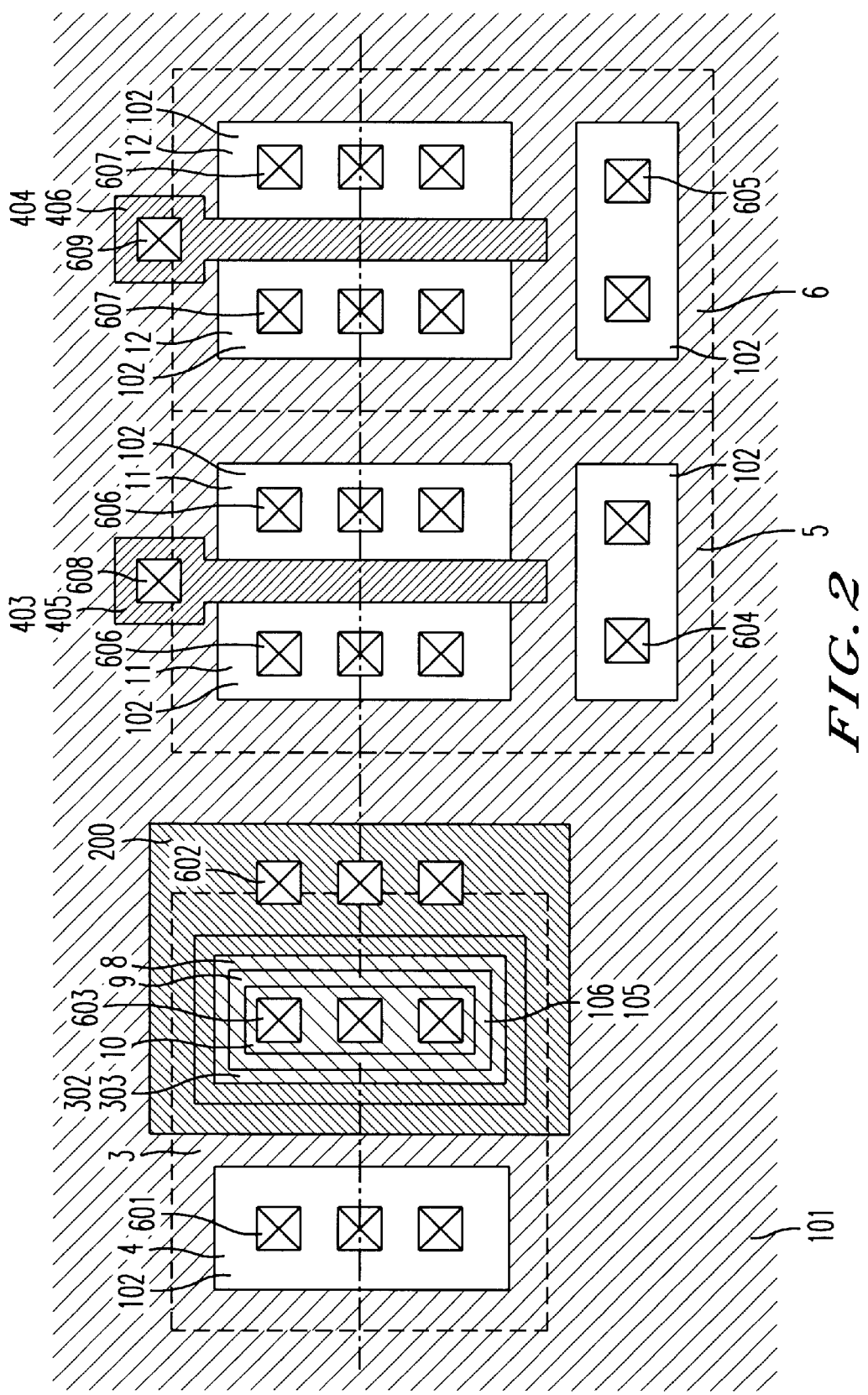
FIG. 2 shows a planar structural view of the Bi-CMOS device according to a first embodiment of the present invention.

FIG. 1 illustrates a cross-sectional structure of a Bi-CMOS device according to a first embodiment of the present invention, and FIG. 2 shows a planar structural view of the Bi-CMOS device of the same.

As shown in the drawings, in the Bi-CMOS device of the first embodiment, an NPN bipolar transistor, a P-channel MOS transistor, and an N-channel MOS transistor are formed on a P-type semiconductor substrate 1.

The NPN bipolar transistor includes a heavily doped N-type buried layer 2 on the lightly doped P-type semiconductor substrate 1, a lightly doped N-type collector layer 3 on the buried layer 2, a heavily doped N-type collector contact layer 4 on the contact portion of the N-type collector layer 3, a moderately doped P-type base layer 9 on the upper portion of the N-type collector layer 3, a heavily doped P-type outer base layer 8 around the P-type base layer 9, and a heavily doped N-type emitter layer 10 on the upper portion of the P-type base layer 9. The periphery of the N-type collector layer 3 is surrounded by a P-type isolating layer 7 of an intermediate concentration and an element isolating oxide film 101 on the P-type isolating layer 7.

The N-type collector contact layer 4 and the P-type outer base layer 8 are also isolated from each other by the element isolating oxide film 101. A base electrode 200 is formed on the P-type outer base layer 8 and extending onto an element isolating oxide film 101, and an emitter electrode 302 is formed on the N-type emitter layer 10. The base electrode 200 is formed with a polycrystalline silicon film where boron is generally introduced as a P-type impurity.

The emitter electrode 302, on the other hand, is formed with a polycrystalline silicon film where arsenic is generally introduced as an N-type impurity. The base electrode 200 and the emitter electrode 302 are isolated by an oxide film 104, a thermal oxide film 105, and a side-wall oxide film 106. In addition, the surface of the emitter electrode 302 is covered with an oxide film 107.

Next, the P-channel MOS transistor includes a lightly doped N-type well layer 5 on the P-type semiconductor substrate 1, a heavily doped P-type source/drain layer 11 on the upper portion of the well layer 5, a gate oxide film 102 on the N-type well layer 5 and the P-type source/drain layer 11, and a gate electrode 403 on the gate oxide film 102 between the P-type source and drain regions of the layer 11.

The gate electrode 403 of the P-channel MOS transistor is formed with upper and lower polycrystalline silicon films 504 and 503, in which arsenic is introduced as an N-type impurity, and also nitrogen is introduced. In addition, nitrogen is segregated near the interface between the lower polycrystalline silicon film 503 and the gate oxide film 102. The upper polycrystalline silicon film 504 is the same film as the emitter electrode 302 of the NPN bipolar transistor, except that nitrogen is introduced. (Into the emitter electrode 302, nitrogen is not introduced.) In addition, the surface of the gate electrode 403 is covered with an oxide film 107.

The N-channel MOS transistor includes a lightly doped P-type well layer 6 on the P-type semiconductor substrate 1, a heavily doped N-type source/drain layer 12 on the upper portion of the well layer 6, a gate oxide film 102 on the N-type well layer 6 and a N-type source/drain layer 12, and a gate electrode 404 on the gate oxide film 102 between the source and drain regions of the N-type source/drain layer 12. Here, the gate electrode 404 is formed with the same upper and lower polycrystalline silicon films 504 and 503 as the gate electrode 403 of the P-channel MOS transistor, and the surface is covered with an oxide film 107.

The NPN bipolar transistor, the P-channel MOS transistor, and the N-channel MOS transistor, formed in the aforementioned way, are isolated by the element isolating oxide film 101, and each transistor is covered with an oxide film 108. Further, contact holes 601 through 609 are formed on the N-type collector contact layer 4, the base electrode 200, the emitter electrode 302, the N-type well layer 5, the P-type well layer 6, the P-type source/drain layers 11, the N-type source/drain layer 12, and the gate electrodes 403 and 404 respectively, and an appropriate metal conductor lead 700 is formed through each contact hole.

Note that the impurity concentration used in this specification means that the low concentration is less than $1E17/cm^3$, the intermediate concentration is greater than $1E17/cm^3$ and less than $1E19/cm^3$, and the high concentration is greater than $1E19/cm^3$.

Figure 23:
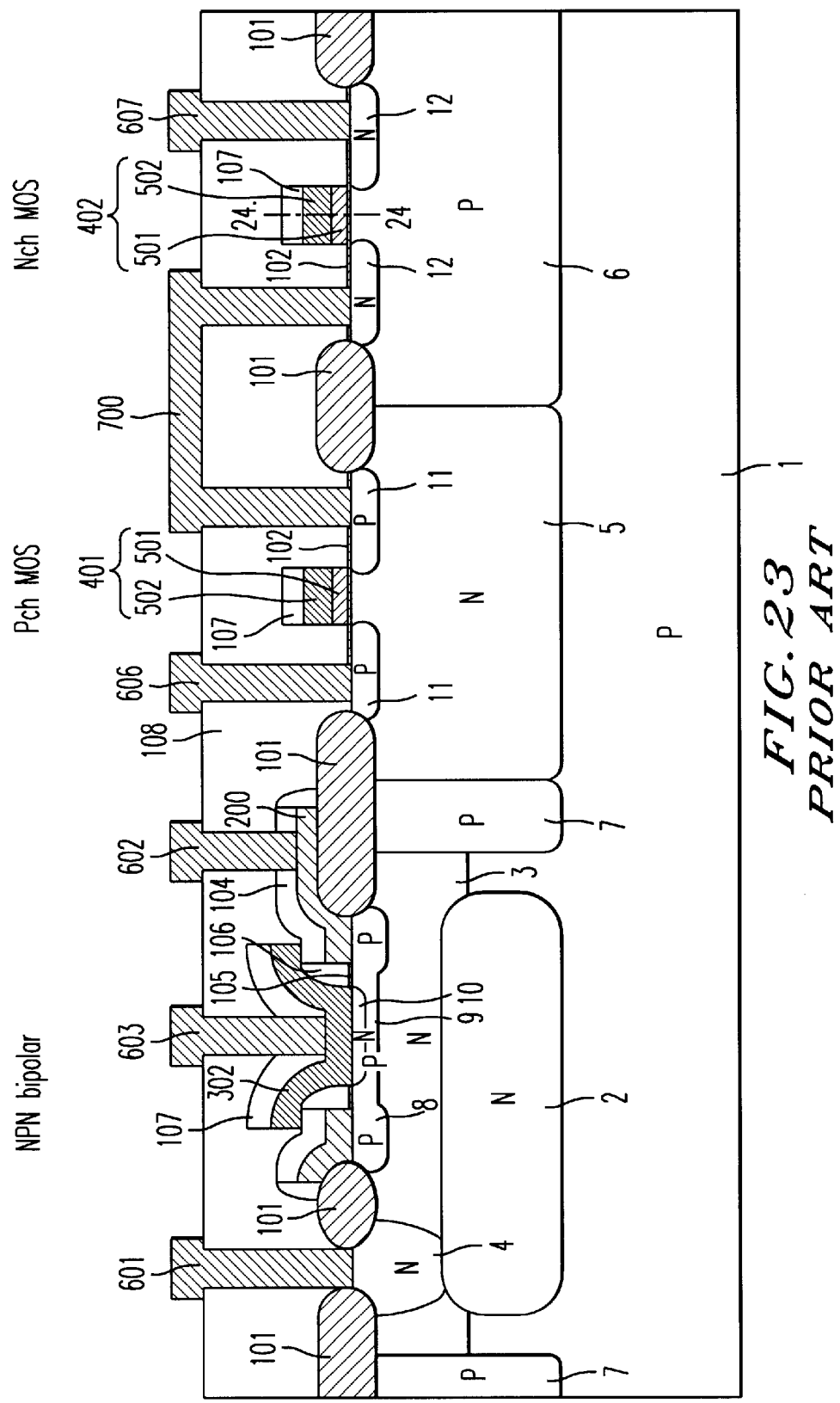
FIG. 23 is a cross-sectional structural view of a conventional Bi-CMOS device.
Figure 24:
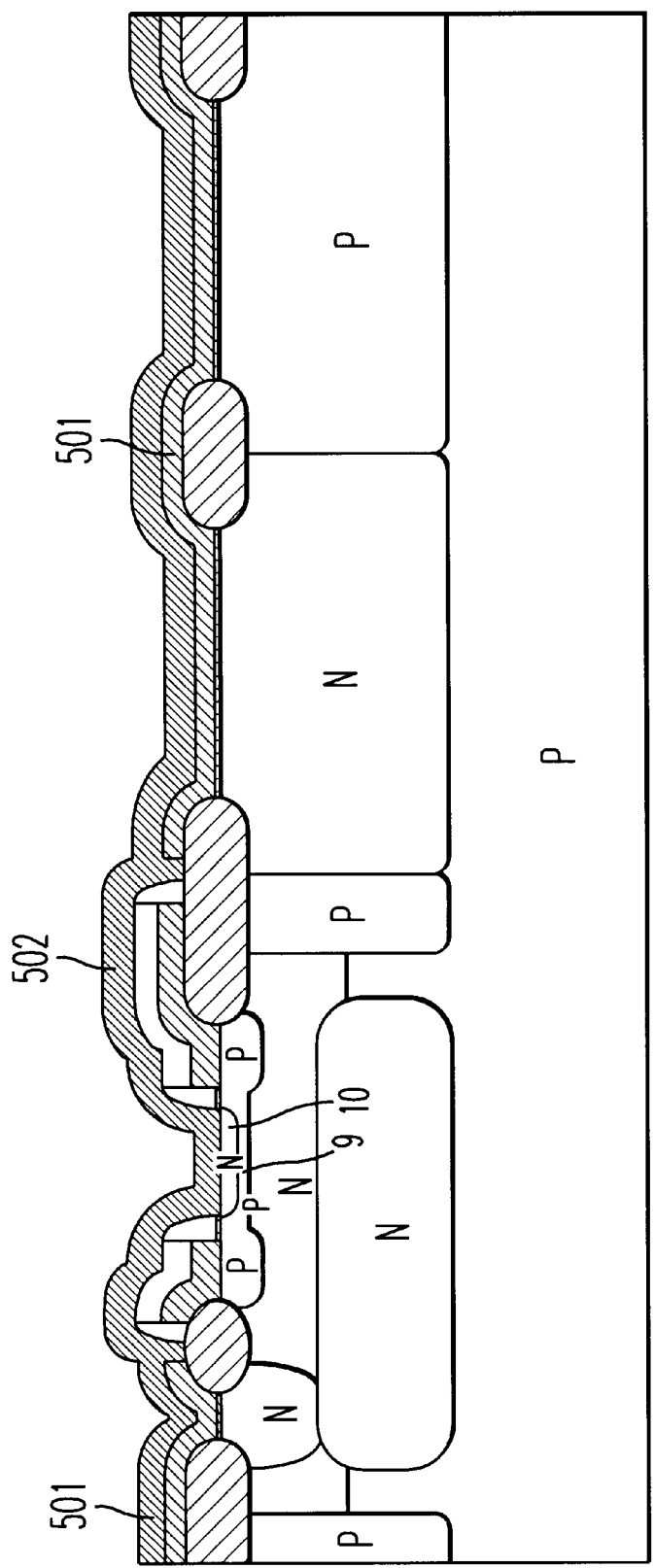
FIG. 24 is a cross-sectional structural view showing a step of a manufacturing method of a conventional Bi-CMOS device.

The point that the semiconductor device of the first embodiment differs from the conventional semiconductor device shown in FIG. 23 is that, in the gate electrodes 403 and 404 of the P-channel and N-channel MOS transistor, each formed with the upper and lower polycrystalline films 504 and 503, nitrogen is introduced into the gate electrodes 403 and 404 in addition to arsenic as an N-type impurity, and the nitrogen is segregated or accumulated near the interface between the lower polycrystalline silicon film 503 and the gate oxide film 102.

Figure 3:
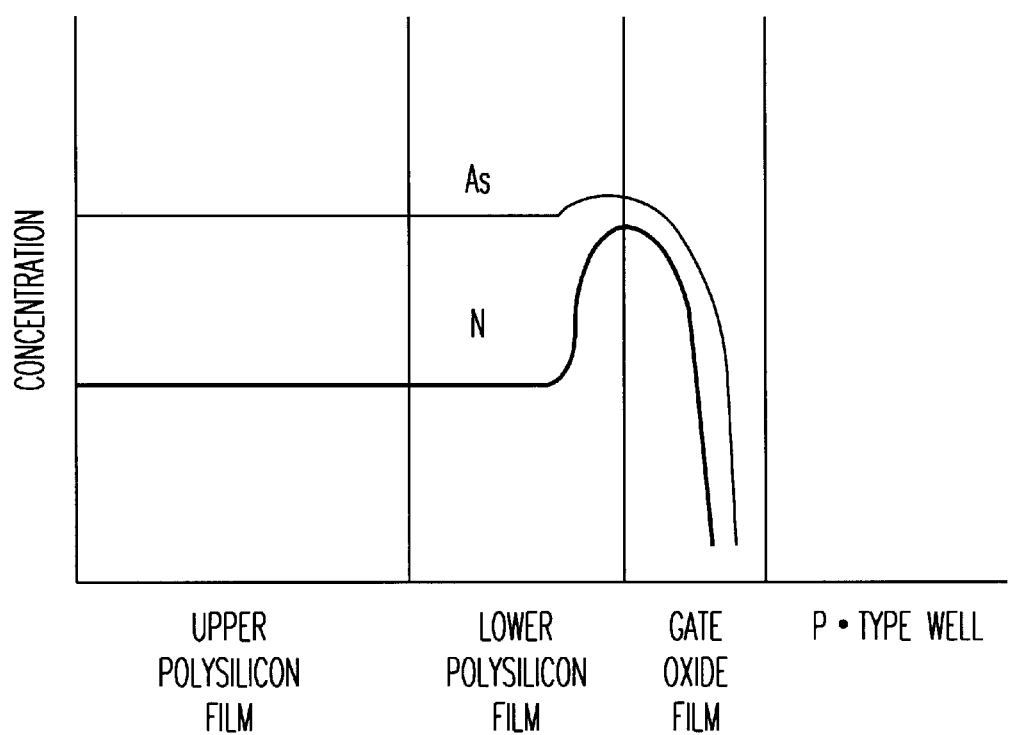
FIG. 3 is a diagram showing a concentration distribution of arsenic and nitrogen in a Bi-CMOS device according to a first embodiment of the present invention.

FIG. 3 is a diagram showing the concentration distribution of arsenic and nitrogen in the portion along the line B–B' of FIG. 1. The concentration graduations on the axis of ordinate are arbitrary, and therefore the relative relationship between arsenic and nitrogen is not considered. On the other hand, the emitter electrode 302 of the NPN bipolar transistor is formed with a polycrystalline silicon film of the same thickness as the upper polycrystalline silicon films 504 of the gate electrode 403 or 404, and arsenic is introduced as an N-type impurity, but nitrogen (more than is naturally contained) has not been introduced. The other structures are the same as the conventional Bi-CMOS device of FIG. 23.

In the first embodiment described above, arsenic has been employed as an N-type impurity, which is introduced into the emitter electrode 302 and the gate electrodes 403 and 404. However, an N-type dopant other than arsenic, such as phosphorus, may be used. In addition, the emitter electrode 302 and the gate electrodes 403 and 404 have been formed with only a polycrystalline silicon film. However, a silicide film of a high-melting-point metal, such as a tungsten silicide, may be deposited on a polycrystalline silicon film of the electrodes.

In addition, although both gate electrodes of the P-channel and N-channel MOS transistors have been of the N-type, the gate electrode 403 of the P-channel MOS transistor may be of the P-type, to form a so-called dual gate CMOS structure. Here, boron is suitable as a P-type impurity which is introduced into the gate electrode 403. Furthermore, a PNP bipolar transistor may be included in the semiconductor device in the first embodiment to form a complementary Bi-CMOS device.

Figure 25:
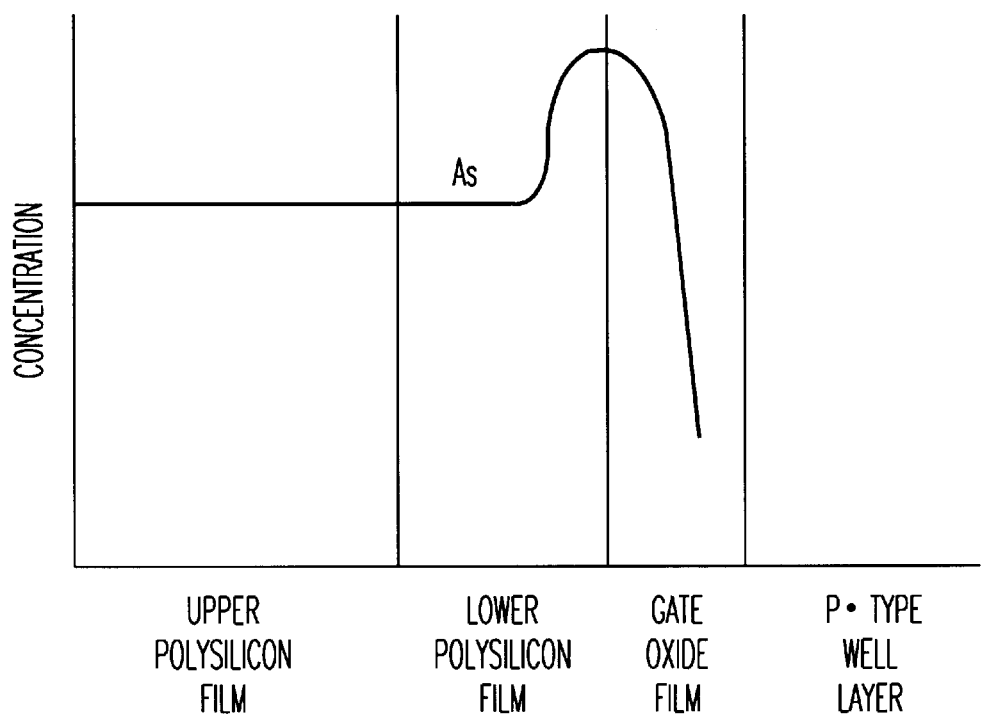
FIG. 25 is a diagram showing the concentration distribution of arsenic in a conventional Bi-CMOS device.

According to the aforementioned first embodiment of the present invention, nitrogen is introduced, as shown in FIG. 3, into the upper and lower polycrystalline silicon films 504 and 503 of the gate electrodes 403 and 404, and nitrogen is segregated or accumulated near the interface between the lower polycrystalline silicon film 503 and the gate oxide film 102. Therefore, the segregation of an impurity such as arsenic near the interface between the gate electrode and the gate oxide film, which has occurred in the conventional Bi-CMOS device as shown in FIG. 25, is suppressed. Furthermore, because nitrogen has not been introduced in the emitter electrode 302, a reduction in the life of the gate oxide film can be prevented without reducing the current amplification factor of the NPN bipolar transistor. Therefore, there is the advantageous effect that the reliability of device operation is enhanced without reducing original device performance.

Second embodiment

Figure 4:
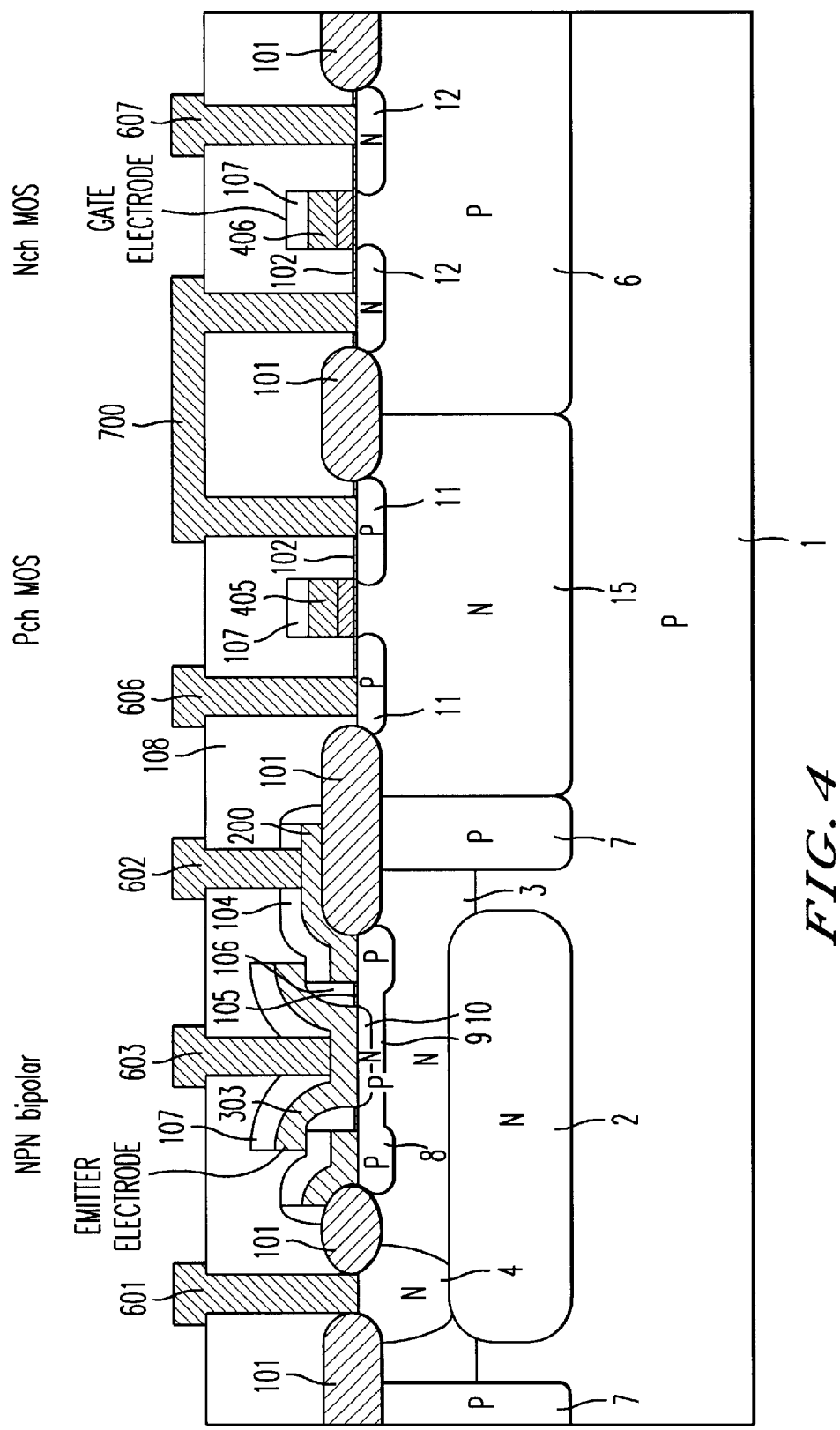
FIG. 4 is a cross-sectional structural view of a Bi-CMOS device according to a second embodiment of the present invention.

FIG. 4 is a cross-sectional structural view of a Bi-CMOS device according to a second embodiment of the present invention. A planar structural view of the Bi-CMOS device is shown by FIG. 2 in the same way as the aforementioned first embodiment.

In the Bi-CMOS device of the second embodiment, as with the first embodiment, an NPN bipolar transistor, a P-channel MOS transistor, and an N-channel MOS transistor are formed on a P-type semiconductor substrate 1. The same reference numerals denote the same parts as FIG. 1 or corresponding parts, and therefore a detailed description is omitted to avoid repetition.

In the Bi-CMOS device of the second embodiment, the gate electrodes 405 and 406 of the P-channel and N-channel MOS transistors are formed with a monocrystalline silicon film, and arsenic is introduced as an N-type impurity. The emitter electrode 303 of the NPN bipolar transistor, on the other hand, is formed with a monocrystalline silicon film thinner than the gate electrodes 405 and 406, and arsenic is introduced as an N-type impurity. The other structures are the same as the Bi-CMOS device of the first embodiment of FIG. 1.

In the second embodiment, arsenic has been employed as an N-type impurity, which is introduced into the emitter electrode 303 and the gate electrodes 405 and 406. However, an N-type dopant other than arsenic, such as phosphorus, may be used. In addition, the emitter electrode 303 and the gate electrodes 405 and 406 have been formed with only a monocrystalline silicon film. However, on a single crystal silicon film of the electrodes, a silicide film of a high-melting-point metal, such as a tungsten silicide, may be deposited.

In addition, although both gate electrodes of the P-channel and N-channel MOS transistors have been of the N-type, the gate electrode 405 of the P-channel MOS transistor may be of the P-type, resulting in a so-called dual gates CMOS structure. Here, boron is suitable as a P-type impurity, which is introduced into the gate electrode 405. Furthermore, a PNP bipolar transistor may be included in the semiconductor device of the second embodiment, resulting in a complimentary Bi-CMOS device.

According to the second embodiment of the present invention, the emitter electrode 303 and the gate electrodes 405 and 406 are all formed with only a monocrystalline silicon film, and yet the emitter electrode is thinner than the gate electrodes, so that the emitter electrode becomes low in vertical electric resistance with respect to the P-type semiconductor substrate 1, and the gate electrodes 405 and 406 become low in horizontal electric resistance with respect to the P-type semiconductor substrate 1. Consequently, there is the advantageous effect that the loss of consumption power is smaller than the conventional Bi-CMOS device and high-speed operation is secured.

Third embodiment

A description of various methods of manufacturing a Bi-CMOS device will be given next. First, FIGS. 5 through 12 are cross-sectional structural views showing a method of manufacturing a Bi-CMOS device (first manufacturing method) according to a third embodiment of the present invention. The manufacturing method in the third embodiment will be described with reference to FIGS. 5 through 12.

Figure 5:
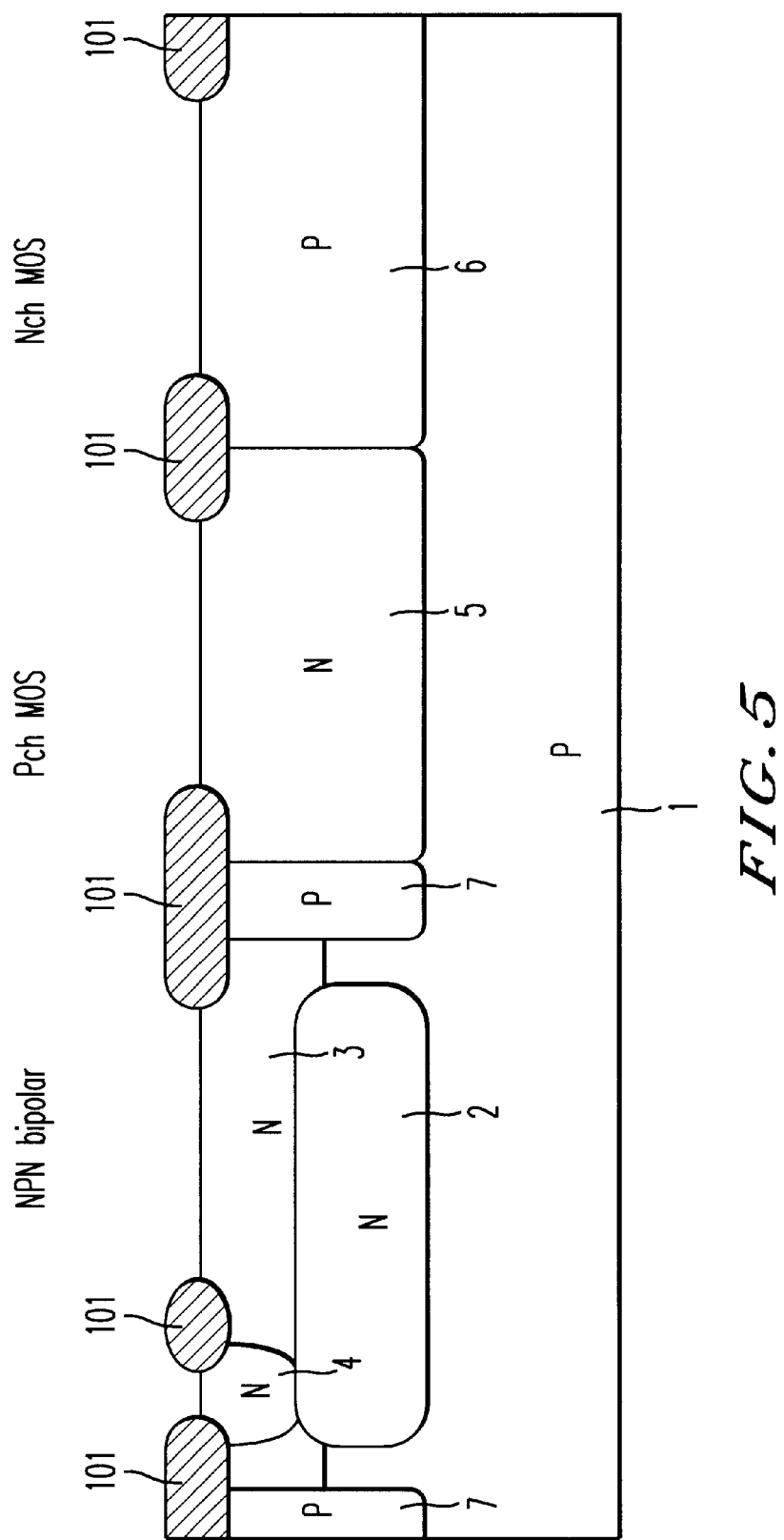
FIGS. 5 through 12 are cross-sectional structural views showing a method of manufacturing a Bi-CMOS device (first manufacturing method) according to a third embodiment of the present invention.

First, as shown in FIG. 5, a heavily doped N-type buried layer 2 is formed in the NPN bipolar transistor formation region of a lightly doped P-type semiconductor substrate 1, and then an N-type epitaxial layer 3 is grown on the entire surface. Thereafter, an element isolating oxide film 101 is formed on each device isolating region and between the collector and base of the NPN bipolar transistor. Subsequently, a heavily doped N-type collector contact layer 4 is formed on collector contact portions of the NPN bipolar transistor formation region, a lightly doped N-type well layer 5 of the P-channel MOS transistor, and a lightly doped P-type well layer of the N-channel MOS transistor are formed, respectively. Further, a moderately doped P-type isolating layer 7 is formed between adjacent N-type epitaxial layers 3, and between the N-type epitaxial layer 3 and the N-type well layer 5. Note that the N-type epitaxial layer 3 becomes the N-type collector layer 3 of the NPN bipolar transistor.

Figure 6:
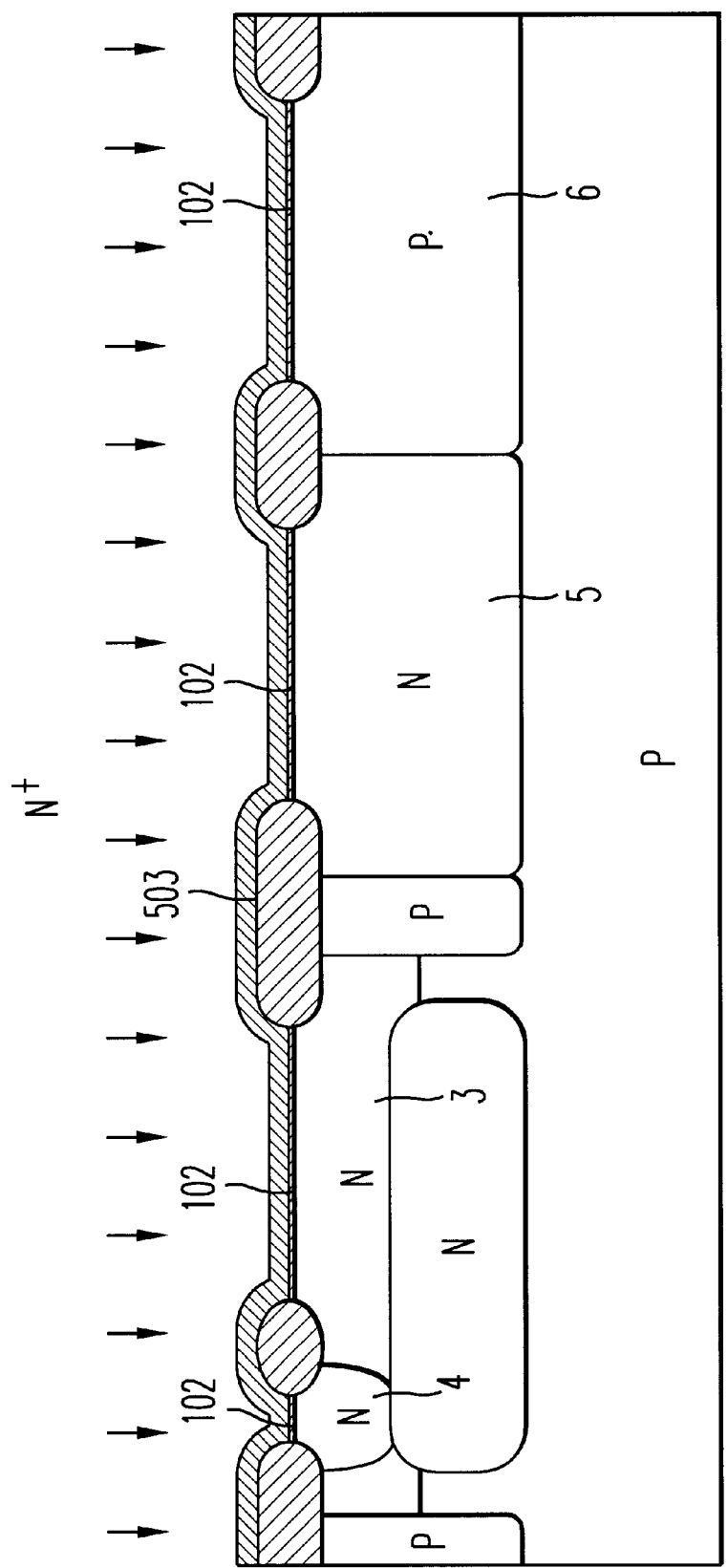

Next, referring to FIG. 6, a gate oxide film 102 of film thickness 10 nm, for example, is formed on each surface of the N-type collector layer 3, the N-type collector contact layer 4, the N-type well layer 5, and the P-type well layer 6. Further, a polycrystalline silicon film of film thickness 50 nm, for example, is formed on the entire surface of the gate oxide film 102. By implanting nitrogen ions into this polycrystalline silicon film, a lower polycrystalline silicon film 503 containing nitrogen is formed. When nitrogen ions are implanted, the ion implantation conditions are set so that nitrogen ions do not reach the gate oxide film 102. In the case of the third embodiment, an implantation energy of 5 KeV and an implantation dose of 7.5E15/cm$^2$ are suitable.

Figure 7:
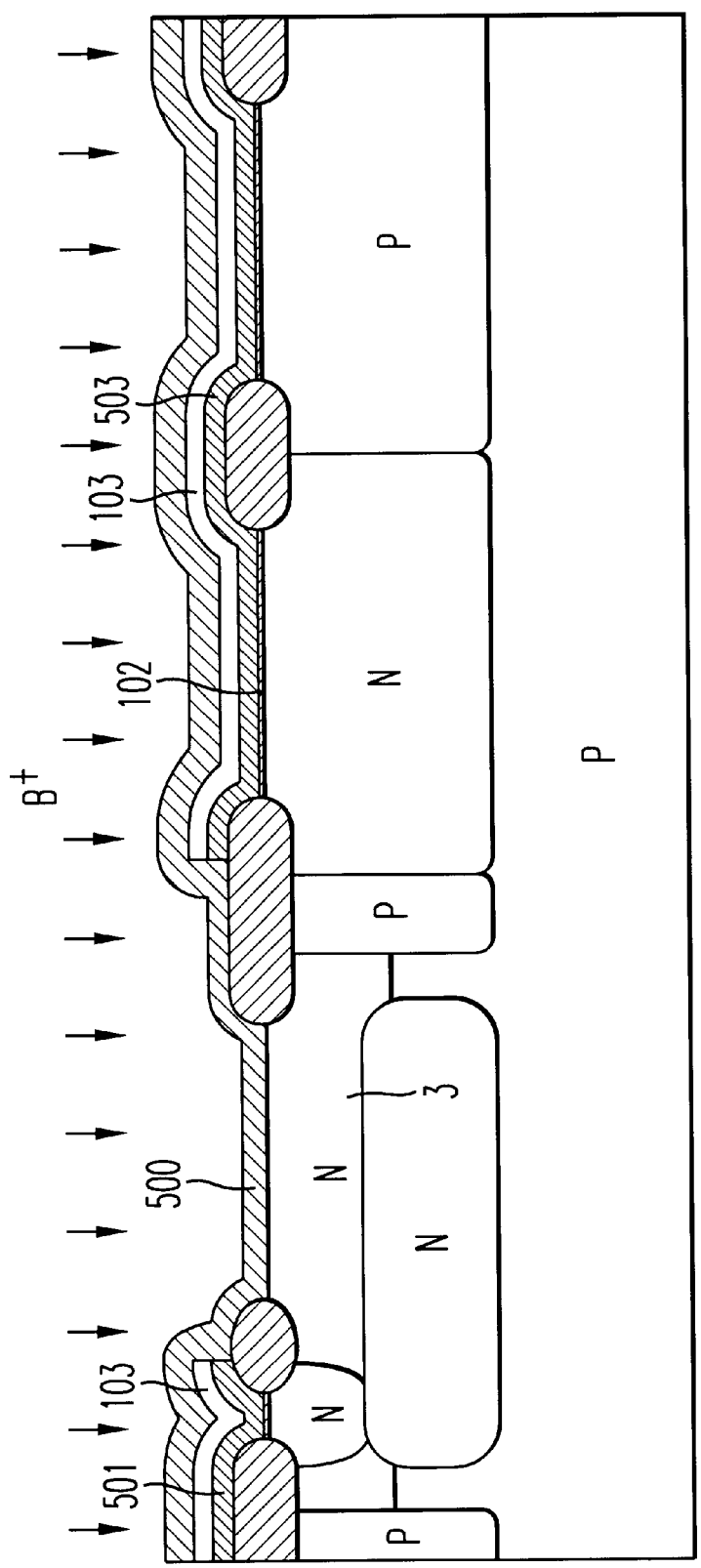

Next, referring to FIG. 7, an oxide film 103 is formed on the entire surface, and the oxide film 103 and the lower polycrystalline silicon film 503 on the surface of the base electrode formation region of the NPN bipolar transistor are removed in sequence. When the oxide film 103 and the lower polycrystalline silicon film 503 are removed, the gate oxide film 102 serves as a protective film for the N-type collector layer 3. Next, the gate oxide film 102 on the surface of the N-type collector layer 3 is removed. Then, a polycrystalline silicon film 500 is formed on the entire surface, and boron ions are implanted into the polycrystalline silicon film 500 so that it becomes a P-type.

Figure 8:
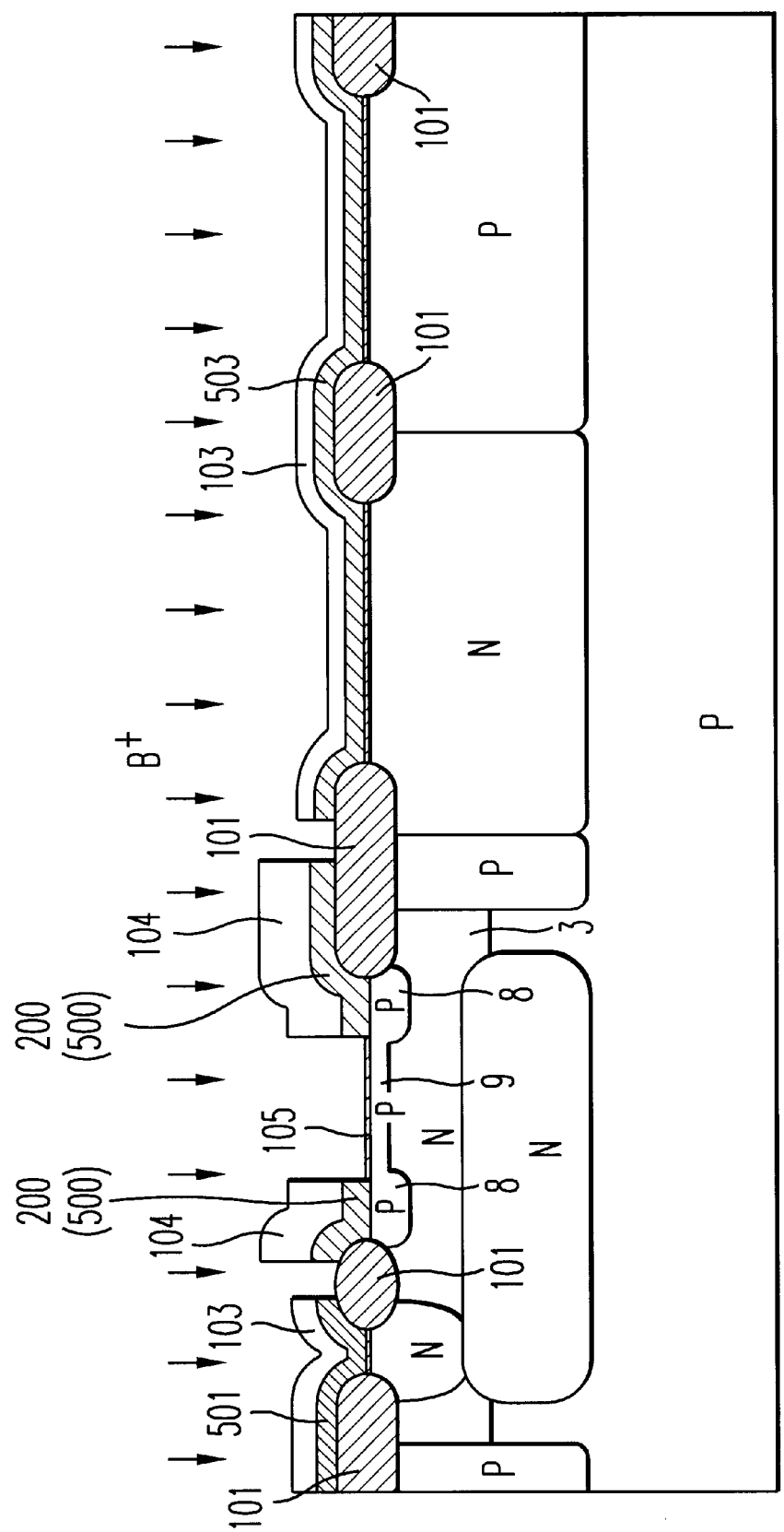

Next, referring to FIG. 8, an oxide film 104 is formed on the entire surface of the polycrystalline silicon film 500. The oxide film 104 and the polycrystalline silicon film 500 are removed in sequence, while the films 104 and 500, deposited on the outer base layer formation region of the N-type collector layer 3 of the NPN bipolar transistor extending onto a portion of the element isolating oxide film 101, are not removed. When the oxide film 104 and polycrystalline silicon film 500 are removed, the gate oxide film 103 serves as a protective film for the lower polycrystalline silicon film 503. Next, a thermal oxide film 105 is formed on the surface of the N-type collector 3 from which the polycrystalline silicon film 500 has been removed. Concurrently, a heavily doped P-type outer base layer 8 is formed by thermal diffusion of boron from the polycrystalline silicon film 500 into the N-type collector layer 3. Thus, the polycrystalline silicon film 500 becomes the base electrode 200 of the NPN bipolar transistor. Further, boron ions are implanted through the thermal oxide film 105 to form a s moderately doped P-type base layer 9 on the upper portion of the N-type collector layer 3. When the ion implantation is performed, the oxide film 103 serves as a mask for the lower polycrystalline silicon film 503.

Figure 9:
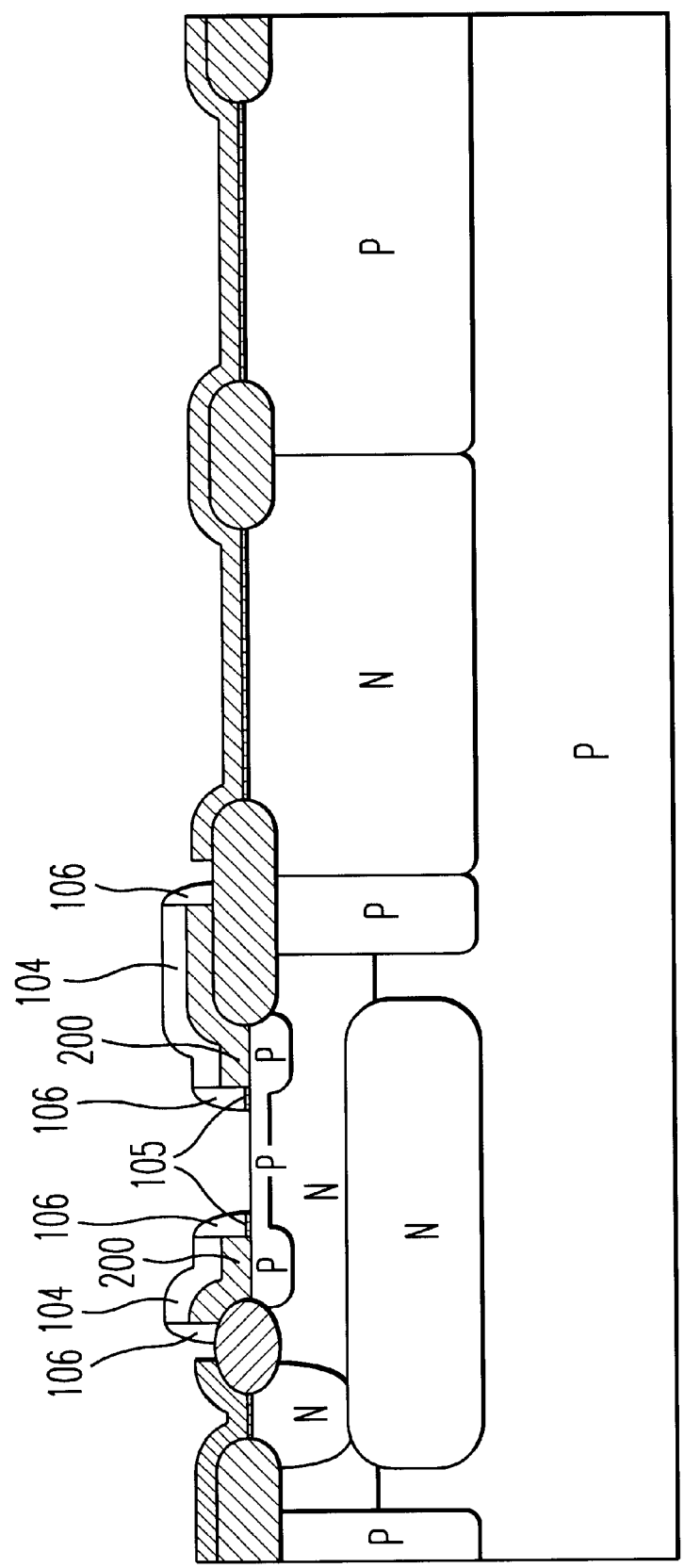

Next, referring to FIG. 9, an oxide film is deposited on the entire surface and side-wall oxide film 106 is formed on the side surface of the base electrode 200 and the oxide film 104 by etching back the deposited oxide film. During this process, the oxide film 103 and the thermal oxide film 105 are removed by over-etching.

Figure 10:
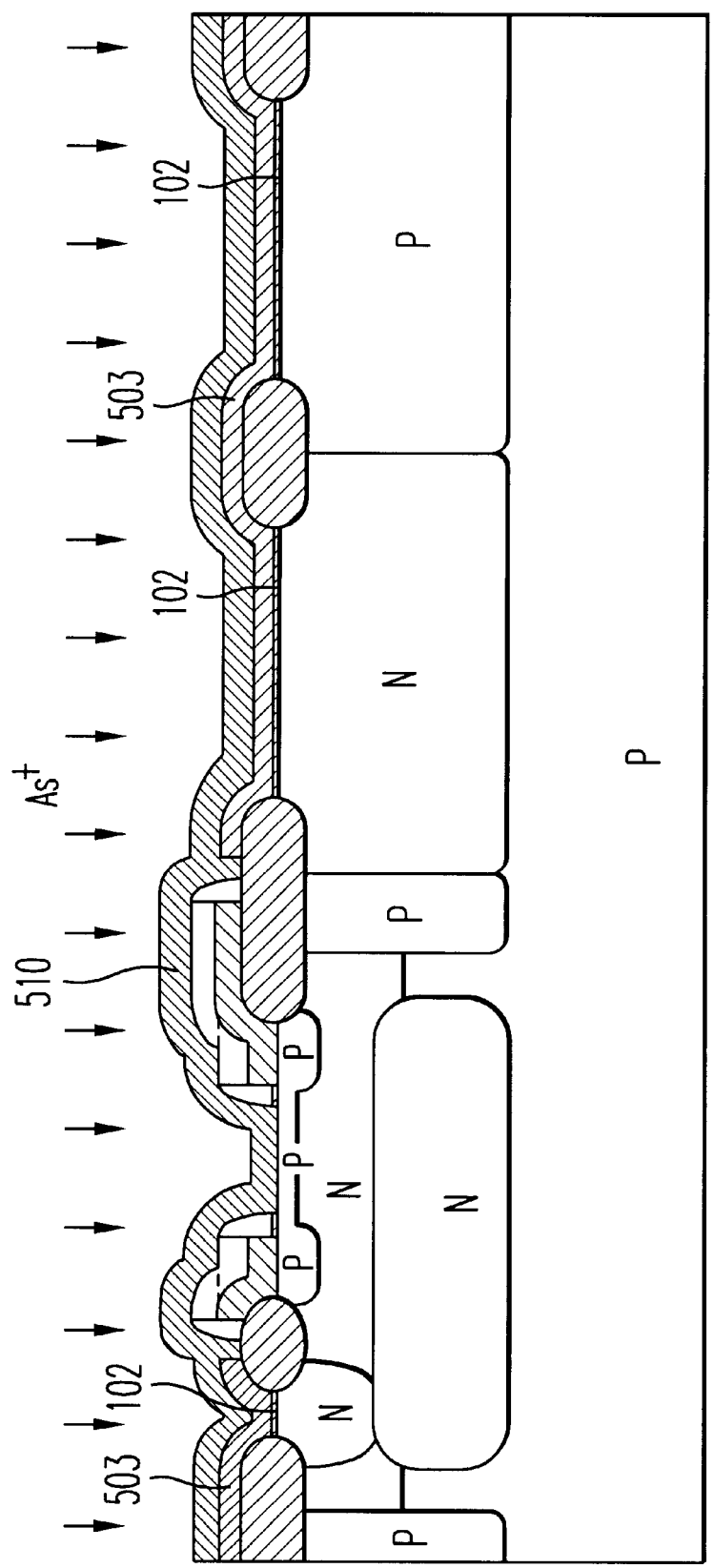

Next, referring to FIG. 10, an amorphous silicon film 510 of film thickness 100 nm, for example, is formed on the entire surface, and arsenic ions are implanted into the amorphous silicon film 510. When arsenic ions are implanted, the ion implantation conditions are set so that arsenic ions do not reach the gate oxide film 102. In the case of the third embodiment, an implantation energy of 50 KeV and an implantation doses of 7.5E15/cm$^2$ are suitable.

Figure 11:
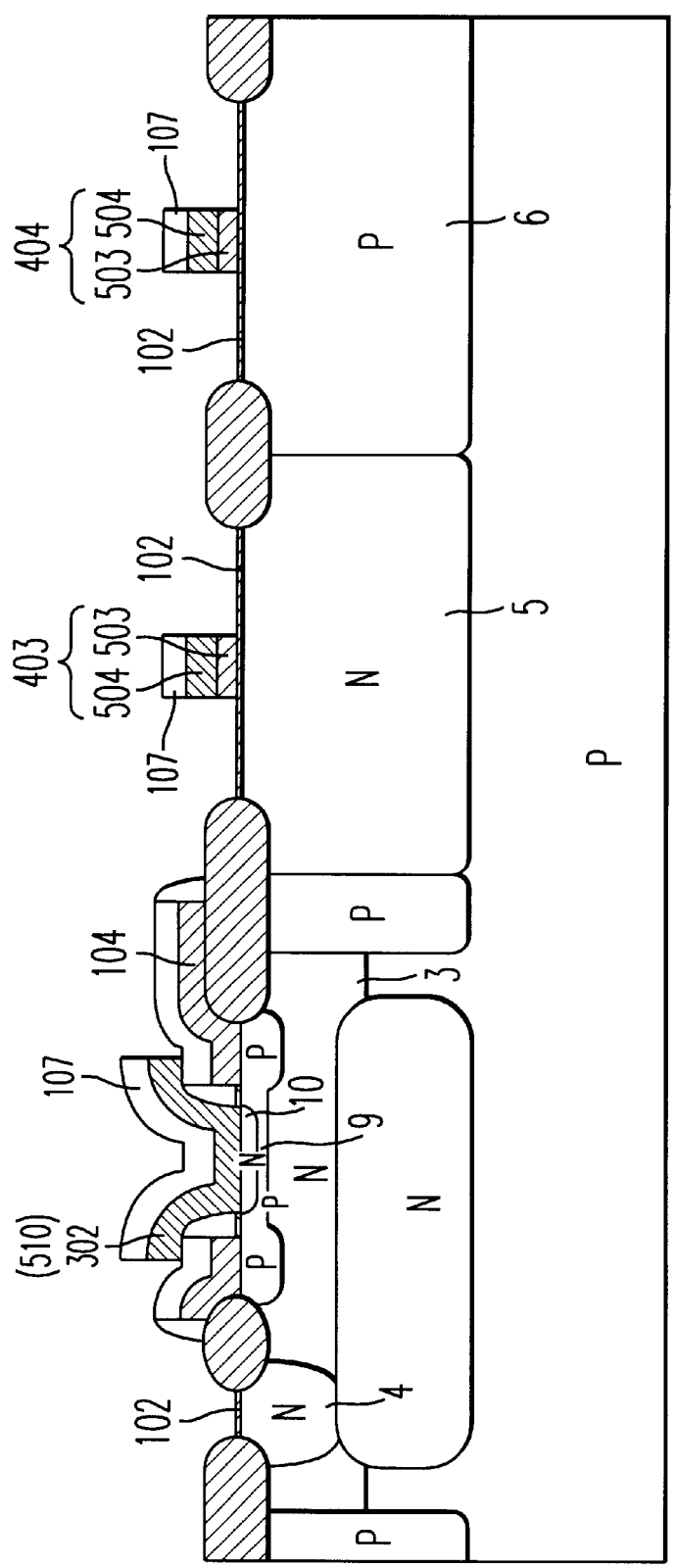

Furthermore, referring to FIG. 11, an oxide is deposited over the entire surface. The oxide film 107, the amorphous silicon film 510, and the lower polycrystalline silicon film 503 are sequentially removed, while the films on the emitter electrode formation region of the NPN bipolar transistor and on the gate electrode formation region of the MOS transistors are not removed. During this process, the gate oxide film 102 serves as a protective film for each surface of the N-type collector contact layer 4, the N-type well layer 5, and the P-type well layer 6. In this way, the emitter electrode 302, consisting of the amorphous silicon film 510, is formed and the gate electrodes 403 and 404, consisting of the upper amorphous silicon film 504 formed from the amorphous silicon film 510 and the lower polycrystalline silicon film 503, are formed.

Thereafter, by performing a thermal treatment at about 850° C., arsenic is thermally diffused from the emitter electrode 302 into the upper portion of the P-type base layer 9 to form a heavily doped N-type emitter layer 10. Simultaneously, the emitter electrode 302 is crystallized and becomes a polycrystalline silicon film. On the other hand, for the gate electrodes 403 and 404, arsenic is thermally diffused from the upper amorphous silicon film 504 into the lower polycrystalline silicon film 503 so that the gate electrodes 403 and 404 become an N-type. Simultaneously, the nitrogen in the lower polycrystalline silicon film 503 is segregated or accumulated near the interface between the lower polycrystalline silicon film 503 and the gate oxide film 102 due to thermal diffusion. In addition, the upper amorphous silicon film 504 is crystallized, and nitrogen is thermally diffused from the lower polycrystalline silicon film 503, whereby the film 504 becomes an upper polycrystalline silicon film 504 containing nitrogen. In this way, the structure shown in FIG. 1 is obtained.

Figure 12:
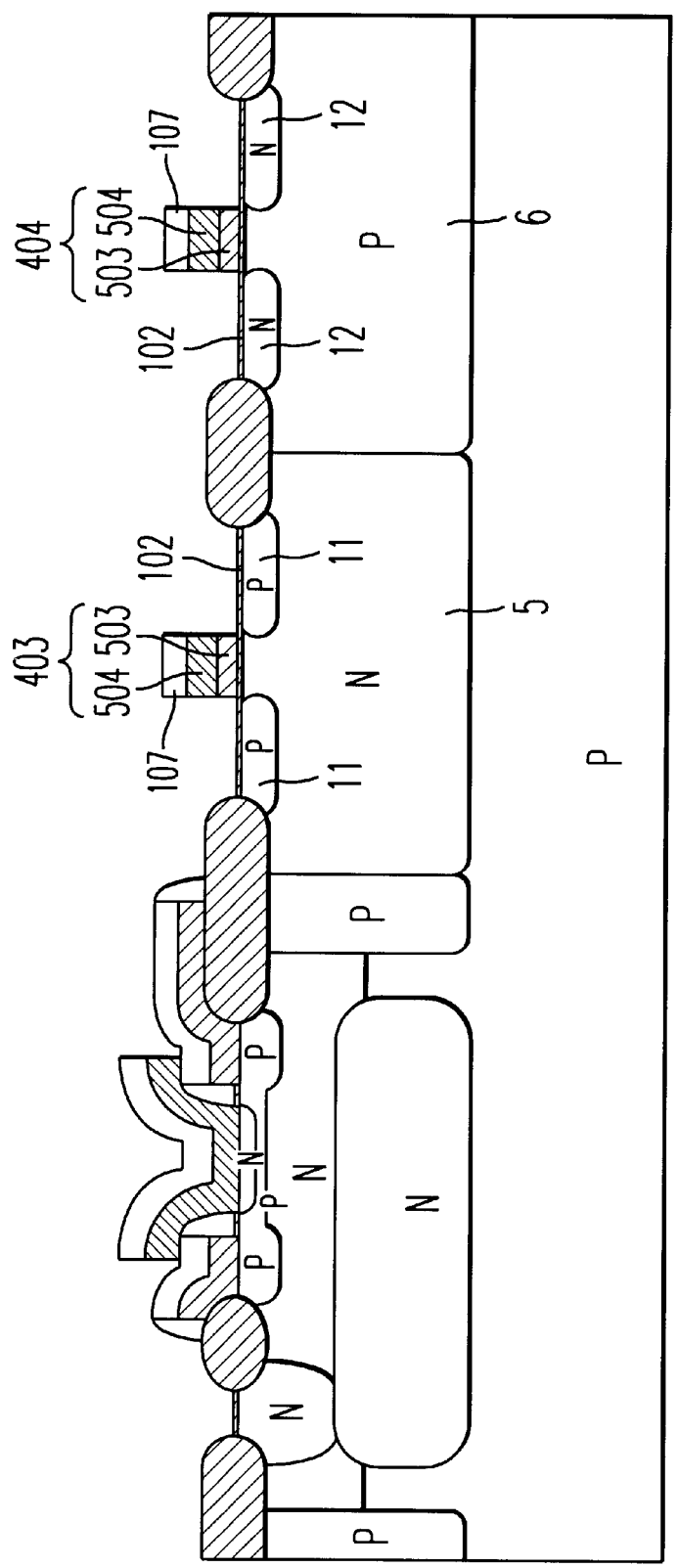

Next, referring to FIG. 12, the bipolar transistor and the N-channel MOS transistor are covered with a photoresist film (not shown), and boron ions are implanted through the gate oxide film 102 to form a heavily doped P-type source/drain layer 11 on the upper portion of the N-type well layer 5. When the ion implantation is performed, the oxide film 107 serves as a mask for the gate electrode 403. Next, the NPN bipolar transistor and the P-channel MOS transistor are covered with a photoresist film (not shown), and arsenic ions are implanted through the gate oxide film 102 to form a heavily doped N-type source/drain layer 12 on the upper portion of the P-type well layer 6. When the ion implantation is performed, the oxide film 107 serves as a mask for the gate electrode 404. Furthermore, the P-type source/drain layer 11 and the N-type source/drain layer 12 are annealed to be activated.

Thereafter, as shown in FIG. 1, an oxide film 108 is deposited on the entire surface. Next, as shown in FIGS. 1 and 2, contact holes 601 through 609 are formed on the N-type collector contact layer 4, the base electrode 200, the emitter electrode 302, the N-type well layer 5, the P-type well layer 6, the P-type source/drain layer 11, the N-type source/drain layer 12, the gate electrode 403 of the P-channel MOS transistor, and the gate electrode 404 of the N-channel MOS transistor, respectively. An appropriate metal conductor lead 700 is formed through each contact hole. In this way, the Bi-CMOS device of the first embodiment shown in FIGS. 1 and 2 can be manufactured.

In the third embodiment of the present invention as described above, arsenic ions have been implanted as N-type impurities into the amorphous silicon film 510 in the step of FIG. 10. However, an N-type dopant other than arsenic, such as phosphorus, may be used.

According to the aforementioned third embodiment, in the step of FIG. 10, the amorphous silicon film 510 is formed as the emitter electrode 302 and as the upper film of the gate electrodes 403 and 404, and arsenic ions are implanted into the amorphous silicon film 510. Therefore, the first problem with the conventional method of manufacturing a Bi-CMOS device, that is, the deterioration in the film quality of the gate oxide film 102 due to the channeling phenomenon of arsenic ions, will not be induced.

Further, according to the third embodiment, in the step of FIG. 6, nitrogen ions are implanted into the polycrystalline silicon film 503, formed as the lower film of the gate electrodes 403 and 404. Then, in the step of FIG. 11, the nitrogen is segregated near the interface between the lower polycrystalline silicon film 503 and the gate oxide film 102 by a thermal treatment. Therefore, in the thermal diffusion of arsenic from the amorphous silicon film 504 into the lower polycrystalline silicon film 503 which occurs concurrently, the segregation of arsenic near the interface between the lower polycrystalline silicon film 503 and the gate oxide film 102 is suppressed. Therefore, the secondary problem with the conventional method of manufacturing a Bi-CMOS device, that is, a reduction in the life of the gate oxide film 102 resulting from the segregation of an impurity, such as arsenic near the interface between the lower polycrystalline silicon film 503 and the gate oxide film 102, can be suppressed. Further, because nitrogen has not been introduced into the emitter electrode 302, there is no reduction in the current amplification factor of the NPN bipolar transistor. Therefore, there is the advantageous effect that a semiconductor device, in which the reliability of device operation is higher than the conventional one, can be manufactured without reducing original device performance.

The manufacturing method according to the third embodiment is summarized as follows. The manufacturing method of a semiconductor device, which includes a bipolar transistor and a MOS transistor on the same semiconductor substrate, comprises (1) a step of forming, on a first conductive type semiconductor substrate 1, a second conductive type collector layer 3, a second conductive type well layer 5, a first conductive type well layer 6, and an element isolating oxide film 101 surrounding each element formation region, (2) a step of forming a gate oxide film 102 on the surface of each device formation region of said collector layer 3 and both well layers 5 and 6, and then forming a first polycrystalline silicon film 503 on the entire surface, (3) a step of introducing nitrogen into said first polycrystalline silicon film 503, (4) a step of removing the first polycrystalline silicon film 503 from a base layer formation region and forming a first conductive type base layer 9 on the upper portion of the collector layer 3, (5) a step of covering the surface of a region other than an emitter layer formation region in said base layer 9 with an insulating film 105, (6) a step of forming an amorphous silicon film 510 on the exposed surface of said emitter layer formation region of the base layer 9 and on the surface of the first polycrystalline silicon film 503, (7) a step of ion-implanting a second conductive type impurity into said amorphous silicon film 510, (8) a step of forming an emitter electrode 302, consisting of the amorphous silicon film 510 on said emitter layer formation region of the base layer 9 extending onto said insulating film 106 and 104, and also forming a gate electrode 403 and 404, consisting of the first polycrystalline silicon film 503 and the amorphous silicon film 504 on the gate oxide film 102 on said second and first conductive type well layers 5 and 6, by patterning said amorphous silicon film 510 and said first polycrystalline silicon film 503, (9) a step of diffusing the second conductive type impurity from said emitter electrode 302 into the upper portion of the base layer 9 to form an emitter layer 10, diffusing the second conductive type impurity from the amorphous silicon film 504 into the first polycrystalline silicon film 503 of said gate electrode 403 and 404, diffusing nitrogen from the first polycrystalline silicon film 503 into the amorphous silicon film 504, and concurrently aggregating nitrogen near the interface between the first polycrystalline silicon film 503 and the gate oxide film 102 by thermal treatment, and simultaneously crystallizing the amorphous silicon film of the emitter electrode 302 and the amorphous silicon film 504 of gate electrodes 403 and 404 to transform these into a second polycrystalline silicon film, and (10) a step of forming a first conductive type source/drain layer 11 in the upper portion of the second conductive type well layer 5, except a portion just under the gate electrode 403, and also forming a second conductive type source/drain layer 12 in the upper portion of the first conductive type well layer 6, except a portion just under the gate electrode 404.

Fourth embodiment

Figure 13:
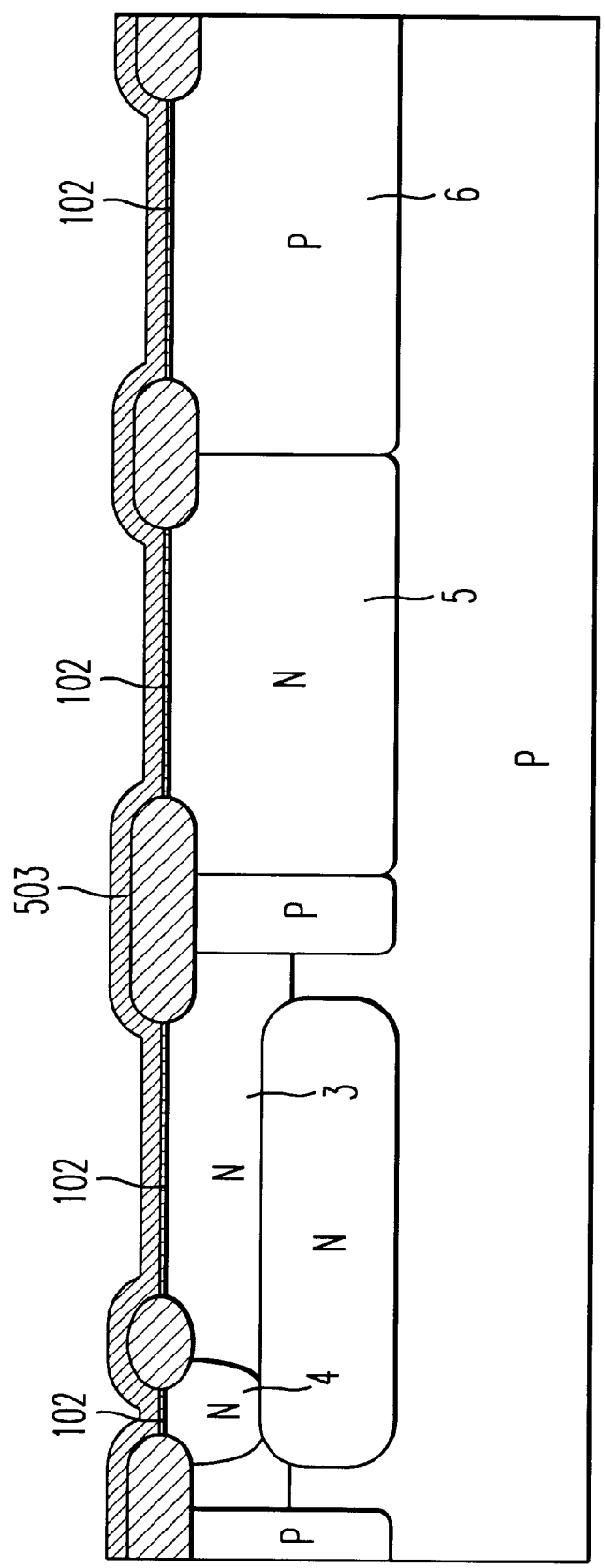
FIG. 13 is a cross-sectional structural view showing a manufacturing method (second manufacturing method) of a Bi-CMOS device according to a fourth embodiment of the present invention.

FIG. 13 is a cross-sectional structural view showing a manufacturing method (second manufacturing method) of a Bi-CMOS device according to a fourth embodiment of the present invention.

In the manufacturing method in the fourth embodiment, the same step as explained with reference to FIG. 5 in the third embodiment is performed first. Thereafter, as shown in FIG. 13, a gate oxide film 102 of film thickness 10 nm, for example, is formed on each surface of the N-type collector layer 3, the N-type collector contact layer 4, the N-type well layer 5, and the P-type well layer 6. Further, a lower polycrystalline silicon film 503 of film thickness 50 nm, for example, which contains nitrogen, is formed on the entire surface of the gate oxide film 102. As a method of forming the lower polycrystalline silicon film 503, which contains nitrogen, a chemical vapor deposition by thermal decomposition of a SiH$_4$—N$_2$ or the like is suitable.

Thereafter, the same steps as those described with reference to FIGS. 7 through 12 in the third embodiment are performed, and the Bi-CMOS device shown in FIGS. 1 and 2 of the first embodiment is manufactured.

In the fourth embodiment as described above, arsenic ions have been implanted as N-type impurities into the amorphous silicon film 510 in the step of FIG. 10, however, an N-type dopant other than arsenic, such as phosphorus, may be used.

According to the fourth embodiment, in the step of FIG. 10, the amorphous silicon film 510 is formed as the emitter electrode 302 and as the overlying film of the gate electrodes 403 and 404, and arsenic ions are implanted into the amorphous silicon film 510. Therefore, the first problem with the conventional manufacturing method of a Bi-CMOS device, that is, deterioration in the film quality of the gate oxide film 102 caused due to the channeling phenomenon of the arsenic ions, is not induced.

Further, according to the fourth embodiment, in the step explained with reference to FIG. 13, the lower polycrystalline silicon film 503 containing nitrogen is formed as the underlying film of the gate electrodes 403 and 404, and then in the step explained with reference to FIG. 11, nitrogen is segregated near the interface between the lower polycrystalline silicon film 503 and the gate oxide film 102 by thermal treatment. Therefore, in the simultaneous thermal diffusion of arsenic from the amorphous silicon film 504 into the lower polycrystalline silicon film 503, the segregation of the arsenic near the interface between the lower polycrystalline silicon film 503 and the gate oxide film 102 is suppressed. Therefore, the secondary problem with the conventional manufacturing method of a Bi-CMOS device, that is, a reduction in the life of the gate oxide film 102 resulting from the segregation of an impurity such as arsenic near the interface between the lower polycrystalline silicon film 503 and the gate oxide film 102, can be suppressed. Further, because nitrogen has not been introduced in the emitter electrode 302, the current amplification factor of the NPN bipolar transistor will not be reduced. Therefore, advantageously, a semiconductor device having higher reliability than the conventional one can be manufactured without reducing original device performance.

The manufacturing method according to the fourth embodiment is summarized as follows. In the manufacturing method of the fourth embodiment, the following two steps of the third embodiment are replaced, i.e. (2) a step of forming a gate oxide film 102 on the surface of each device formation region of the collector layer 3 and both well layers 5 and 6, and then forming a first polycrystalline silicon film 503 on the entire surface, and (3) a step of introducing nitrogen into said first polycrystalline silicon film 503. Instead, introduced is a step of forming a gate oxide film 102 on the surface of each device formation region of said collector layer 3 and both well layers 5 and 6, and then forming a first polycrystalline silicon film 503 previously containing nitrogen on the entire surface.

Fifth embodiment

Figure 14:
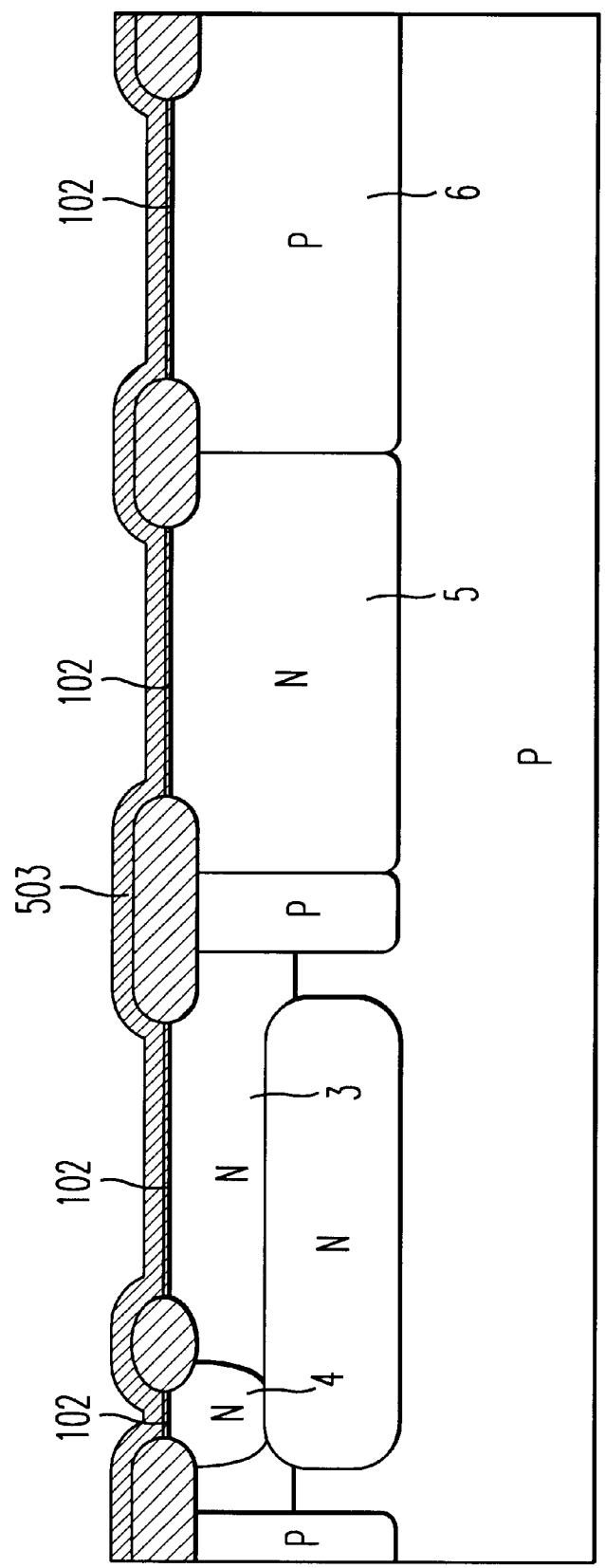
FIGS. 14 and 15 are cross-sectional structural views showing a manufacturing method (third manufacturing method) of a Bi-CMOS device according to a fifth embodiment of the present invention.
Figure 15:
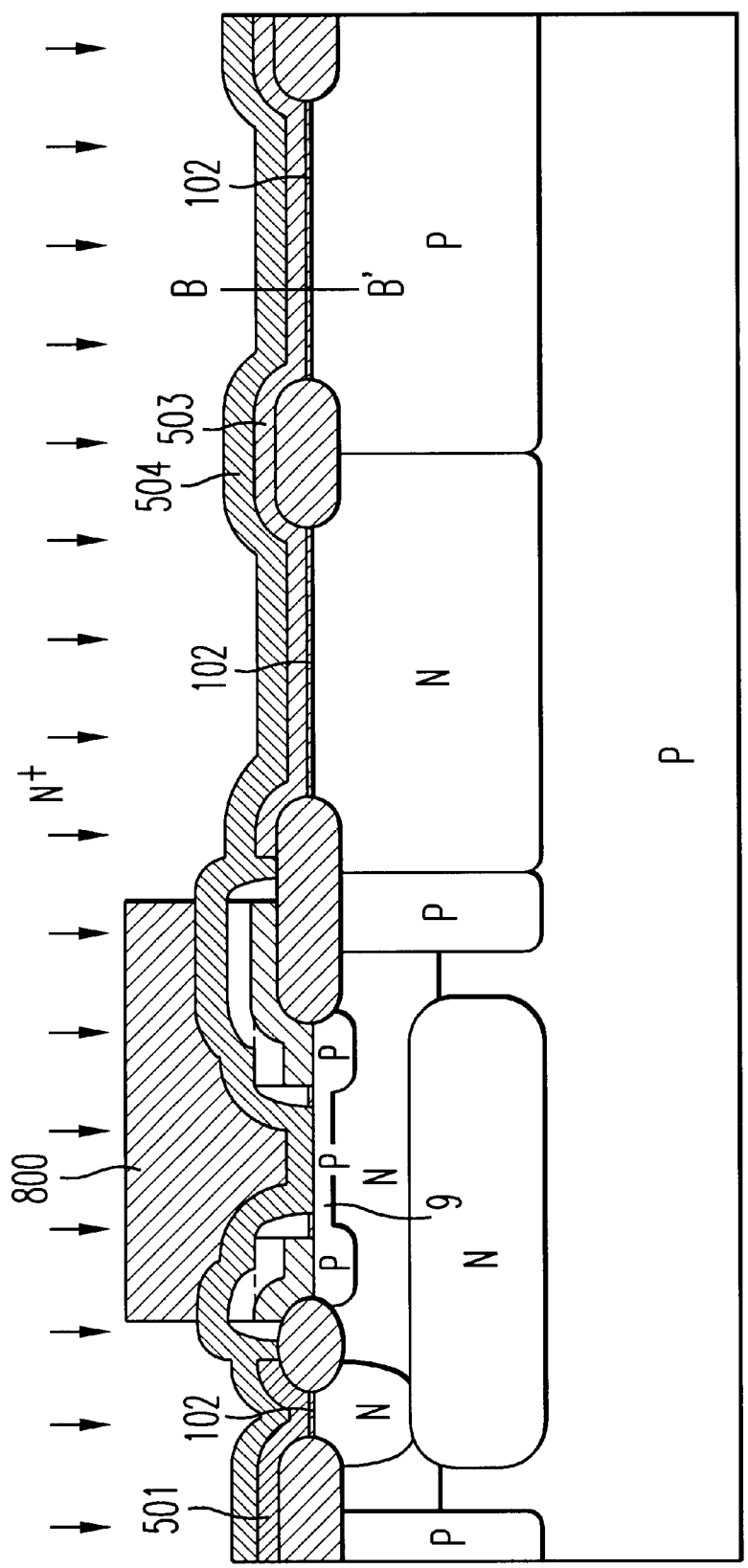

FIGS. 14 and 15 are cross-sectional structural views showing a manufacturing method (third manufacturing method) of a Bi-CMOS device according to a fifth embodiment of the present invention.

In the manufacturing method in the fifth embodiment, the same step as shown in FIG. 5 in the manufacturing method of the third embodiment is performed first. Next, as shown in FIG. 14, a gate oxide film 102 is formed on each surface of the N-type collector layer 3, the N-type collector contact layer 4, the N-type well layer 5, and the P-type well layer 6. Further, a lower polycrystalline silicon film 503 is formed on the entire surface of the gate oxide film 102. Subsequently, the steps described with reference to FIGS. 7 through 9 of the aforementioned third embodiment are performed.

Thereafter, as shown in FIG. 15, an upper polycrystalline silicon film 504 of film thickness 100 nm, for example, is formed on the entire surface. Then, the emitter electrode formation region of the bipolar transistor is covered with a photoresist film 800, and with this photoresist film 800 as a mask, nitrogen ions are implanted into the upper polycrystalline silicon film 504. When the nitrogen ions are implanted, the ion implantation conditions are set so that nitrogen ions do not reach the gate oxide film 102. In the case of the fifth embodiment, an implantation energy of 15 KeV and an implantation dose of $7.5E15/cm^2$ are suitable. At this time, in the upper polycrystalline silicon film 504, an amorphous layer is formed at a depth around the projected range of the nitrogen ions.

Thereafter, the photoresist film 800 is removed, and arsenic ions are implanted into the entire surface of the upper polycrystalline silicon film 504. For this purpose, the implantation energy of arsenic ions is set so that the projected range of arsenic ions is shallower than the amorphous layer formed in the upper polycrystalline silicon layer 504, shown in the step of FIG. 15. In the case of this embodiment, it is suitable that the implantation energy is less than 50 KeV.

Figure 16:
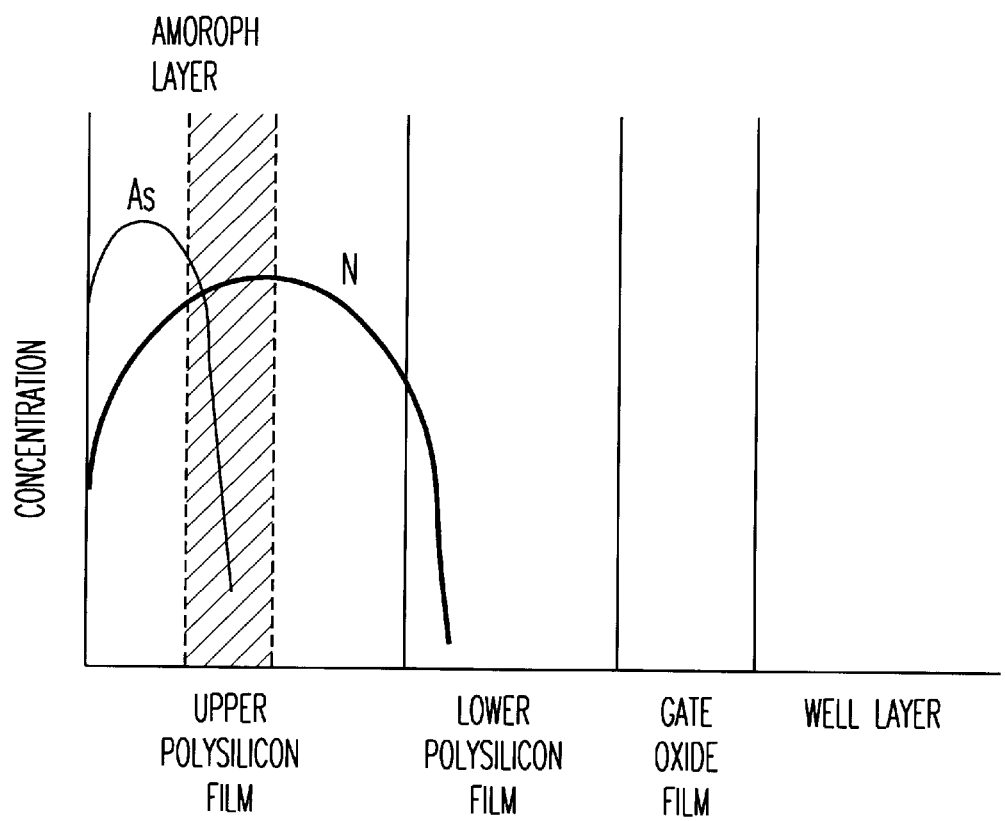
FIG. 16 is a diagram showing each concentration distribution of arsenic and nitrogen immediately after arsenic ions are introduced in a Bi-CMOS device according to a fifth embodiment of the present invention.

FIG. 16 is a diagram showing the concentration distribution of arsenic and nitrogen in the portion along the line B–B' of FIG. 15, immediately after arsenic ions are introduced. The concentration graduations on the axis of ordinate are arbitrary, and therefore the relative concentration between arsenic and nitrogen is not defined in the diagram.

Next, referring to FIG. 11 in the third embodiment, an oxide film 107 is deposited over the entire surface. The oxide film 107, the upper polycrystalline silicon film 504, and the lower polycrystalline silicon film 503 are sequentially removed, while those films on the emitter electrode formation region of the NPN bipolar transistor and the gate electrode formation regions of the MOS transistors are not removed. During this process, the gate oxide film 102 serves as a protective film for each surface of the N-type collector contact layer 4, the N-type well layer 5, and the P-type well layer 6. In this way, the emitter electrode 302, consisting of the upper polycrystalline silicon film 504 is formed and the gate electrodes 403 and 404, consisting of the lower polycrystalline silicon film 503 and the upper polycrystalline silicon film 504 containing nitrogen, are formed.

Thereafter, during a thermal treatment at about 850° C., arsenic is thermally diffused from the emitter electrode 302 into the upper portion of the P-type base layer 9 to form a heavily doped N-type emitter layer 10.

In the gate electrodes 403 and 404, nitrogen and arsenic are thermally diffused at the same time from the upper polycrystalline silicon film 504 into the lower polycrystalline silicon film 503, and the lower polycrystalline silicon film 503 then contains nitrogen for an N-type. When this occurs, the nitrogen diffused in the lower polycrystalline silicon film 503 is segregated near the interface between the lower polycrystalline silicon film 503 and the gate oxide film 102. In this way, the structure as shown in FIG. 11 is obtained (although, some of reference numerals differ). During the thermal treatment, the amorphous layer, which is formed in the upper polycrystalline layer 504 by the nitrogen implantation in FIG. 15, is polycrystallized.

Thereafter, the same steps as that described with reference to FIG. 12 in the third embodiment are performed, and the Bi-CMOS device as shown FIGS. 1 and 2 of the first embodiment is manufactured.

In the fifth embodiment as described, arsenic ions have been implanted as N-type impurities into the upper polycrystalline silicon film 504 in the step of FIG. 15. However, an N-type dopant other than arsenic, such as phosphorus, may be used.

According to the fifth embodiment, in the step of FIG. 15, the upper polycrystalline silicon film 504 is formed as the emitter electrode 302 and as the overlying film of the gate electrodes 403 and 404, and arsenic ions are implanted into a region other than the emitter electrode formation region of the upper polycrystalline silicon film 504 to form an amorphous layer in the upper polycrystalline silicon film 504. Thereafter, arsenic ions are implanted in a shallower projected range than the amorphous layer as shown in FIG. 16. Therefore, the first problem with the conventional manufacturing method of a Bi-CMOS device, that is, the deterioration in the quality of the gate oxide film 102 caused due to the channeling phenomenon of arsenic ions, is not induced.

Furthermore, according to the fifth embodiment, in the step of FIG. 15, nitrogen ions are implanted into a region other than the emitter electrode formation region of the upper polycrystalline silicon film 504, and then nitrogen is segregated around the interface between the lower polycrystalline silicon film 503 and the gate oxide film 102, by thermal treatment. Therefore, in the thermal diffusion of arsenic from the upper polycrystalline silicon film 504 into the lower polycrystalline silicon film 503, which occurs at the same time, the segregation of arsenic around the interface between the lower polycrystalline silicon film 503 and the gate oxide film 102 is suppressed. Thus, the secondary problem with the conventional manufacturing method of a Bi-CMOS device, that is, a reduction in the life of the gate oxide film resulting from the segregation of an impurity such as arsenic around the interface between the lower polycrystalline silicon film 503 and the gate oxide film 102, can be suppressed. Further, because nitrogen has not been introduced into the emitter electrode 302, there is no reduction in the current amplification factor of the NPN bipolar transistor. Therefore, advantageously, a semiconductor device can be manufactured having a higher reliability than the conventional one without reducing original device performance.

The manufacturing method according to the fifth embodiment is summarized as follows. A method of manufacturing a semiconductor device which has a bipolar transistor and a MOS transistor on the same semiconductor substrate, includes (1) a step of forming, on a first conductive type semiconductor substrate 1, a second conductive type collector layer 3, a second conductive type well layer 5, a first conductive type well layer 6, and an element isolating oxide film 101 surrounding each device formation region, (2) a step of forming a gate oxide film 102 on the surface of each device formation region of said collector layer 3 and both well layers 5 and 6, and then forming a first polycrystalline silicon film 503 on the entire surface, (3) a step of removing the first polycrystalline silicon film 503 from a base layer formation region, and forming a first conductive type base layer 9 on the upper portion of the collector layer 3, (4) a step of covering the surface of a region other than an emitter layer formation region in said base layer 9 with an insulating film 104 and 106, (5) a step of forming a second polycrystalline silicon film 504 on the exposed surface of said emitter layer formation region of the base layer 9 and the surface of the first polycrystalline silicon film 503, and covering an emitter electrode formation region of the second polycrystalline silicon film 504 with a protective film 800, (6) a step of ion-implanting nitrogen into the second polycrystalline silicon film 504 with the said protective layer 800 as a mask, and forming an amorphous layer in the second polycrystalline silicon film 504, (7) a step of ion-implanting, after removal of said protective film 800, a second conductive type impurity into the entire surface of the second polycrystalline silicon film 504 with an implantation energy where a projected range of the implanted ion is shallower than said amorphous layer, (8) a step of forming an emitter electrode 302, consisting of the second polycrystalline silicon film 504 on said emitter layer formation region of the base layer 9 extending onto said insulating film 105 and 104, and also forming each gate electrode 403 and 404, consisting of the first polycrystalline silicon film 503 and the second polycrystalline silicon film 504 on the gate oxide film 102 on said second and first conductive type well layers 5 and 6, by patterning said second polycrystalline silicon film 504 and said first polycrystalline silicon film 503, (9) a step of diffusing, by thermal treatment, the second conductive type impurity from said emitter electrode 302 into the upper portion of the base layer 9 to form an emitter layer 10, diffusing the second conductive type impurity and nitrogen at the same time from said second polycrystalline silicon film 504 into the first polycrystalline silicon film 503 of the gate electrodes 403 and 404, and aggregating nitrogen around the interface between the first polycrystalline silicon film 503 and the gate oxide film 102, and (10) a step of forming a first conductive type source/drain layer 11 in the upper portion of the second conductive type well layer 5, except a portion just under the gate electrode 403, and also forming a second conductive type source/drain layer 12 in the upper portion of the first conductive type well layer 6, except a portion just under the gate electrode 404.

Further, the protective film 800 is preferably a photoresist film formed by photolithography.

Sixth embodiment

Figure 17:
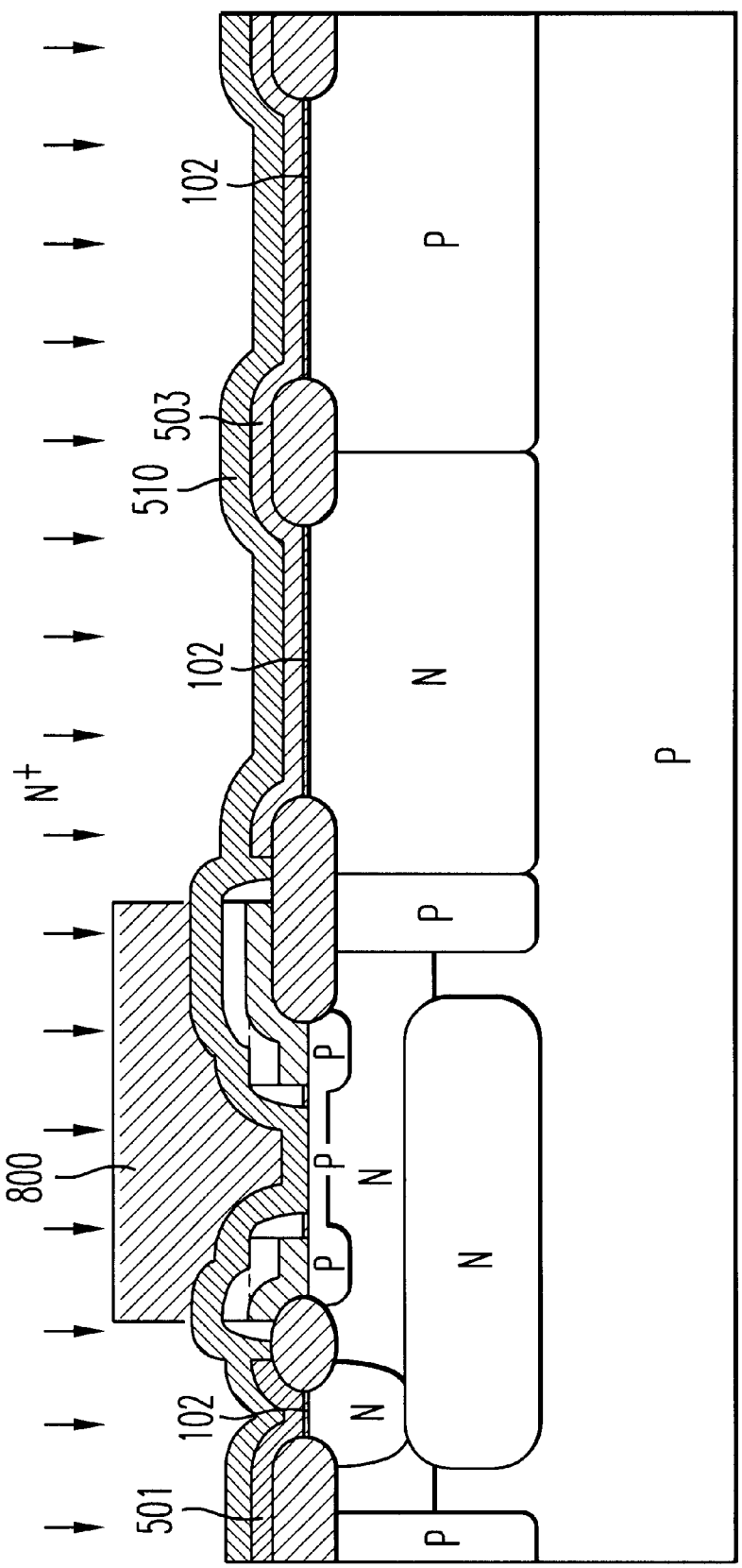
FIG. 17 is a cross-sectional structural view showing a manufacturing method (fourth manufacturing method) of a Bi-CMOS device according to a sixth embodiment of the present invention.

FIG. 17 is a cross-sectional structural view showing a manufacturing method (fourth manufacturing method) of a Bi-CMOS device according to a sixth embodiment of the present invention.

In the manufacturing method in the sixth embodiment, the same step as shown in FIG. 5 in the manufacturing method of the third embodiment is performed first. Next, the same step as shown in FIG. 14 in the manufacturing method of the fifth embodiment is performed. Then, the steps are performed as described with reference to FIGS. 7 through 9 in the manufacturing method of the third embodiment.

Thereafter, as shown in FIG. 17, an amorphous silicon film 510 of film thickness 100 nm, for example, is formed on the entire surface. Then, the emitter electrode formation region of the bipolar transistor is covered with a photoresist film 800, and with this photoresist film as a mask, nitrogen ions are implanted into the amorphous silicon film 510. When the ions are implanted, the ion implantation conditions are set so that nitrogen ions do not reach the gate oxide film 102. In the case of the sixth embodiment, an implantation energy of 15 KeV and an implantation dose of $7.5E15/cm^2$ are suitable.

Thereafter, the photoresist film 800 is removed, and arsenic ions are implanted into the entire surface of the amorphous silicon film 510. At this process, the ion implantation conditions are set so that nitrogen ions do not reach the gate oxide film 102. In the case of the sixth embodiment, an implantation energy of 50 KeV and an implantation dose of $7.5E15/cm^2$ are suitable.

Next, referring to FIG. 11 of the third embodiment, an oxide film 107 is formed over the entire surface. Then, the oxide film 107, the amorphous silicon film 510, and the lower polycrystalline silicon film 503 are sequentially removed, while those films of the emitter electrode formation region of the NPN bipolar transistor and the gate electrode formation region of the MOS transistor are not removed. At this process, the gate oxide film 102 serves as a protective film for each surface of the N-type collector contact layer 4, the N-type well layer 5, and the P-type well layer 6. In this way, the emitter electrode 302, consisting of the amorphous silicon film 510, is formed. Also, the gate electrodes 403 and 404 are formed, consisting of the upper amorphous silicon film 504, which is formed from the amorphous silicon film 510 containing nitrogen and the lower polycrystalline silicon film 503.

Thereafter, by thermal treatment at about 850° C., arsenic is thermally diffused from the emitter electrode 302 into the upper portion of the P-type base layer 9 to form a heavily doped N-type emitter layer 10. At the same time, the emitter electrode 302 is crystallized and becomes a polycrystalline silicon film. In the gate electrodes 403 and 404, nitrogen and arsenic is thermally diffused at the same time from the upper amorphous silicon film 504 into the lower polycrystalline silicon films 503, and the lower polycrystalline silicon film 503 then contains nitrogen for an N-type. When this occurs, the nitrogen diffused in the lower polycrystalline silicon film 503 is segregated around the interface between the lower polycrystalline silicon film 503 and the gate oxide film 102. In addition, the upper amorphous silicon film 504 is crystallized and becomes an upper polycrystalline silicon film 504 containing nitrogen. In this way, the structure as shown in FIG. 11 of the third embodiment is obtained.

Thereafter, the same step as that described with reference to FIG. 12 in the third embodiment are performed, and the Bi-CMOS device as shown in FIGS. 1 and 2 of the first embodiment is manufactured.

In the sixth embodiment as described above, arsenic ions have been implanted as N-type impurities into the amorphous silicon film after the step of FIG. 17. However, an N-type dopant other than arsenic, such as phosphorus, may be used.

According to the sixth embodiment, in the step of FIG. 17, the amorphous silicon film 510 is formed as the emitter electrode 302 and as the overlying film of the gate electrodes 403 and 404, and thereafter, arsenic ions are implanted into the amorphous silicon film 510. Therefore, the first problem with the conventional method of manufacturing a Bi-CMOS device, that is, the deterioration in the quality of the gate oxide film 102 caused due to the channeling phenomenon of arsenic ions, is not induced.

Furthermore, according to the sixth embodiment, in the step of FIG. 17, nitrogen ions are implanted into the amorphous silicon film 510 in a region other than the emitter electrode formation region, and then nitrogen is segregated near the interface between the lower polycrystalline silicon film 503 and the gate oxide film 102 by thermal treatment. Therefore, in the thermal diffusion of arsenic from the upper polycrystalline silicon film 504 into the lower polycrystalline silicon film 503, which occurs at the same time, the segregation of arsenic around the interface between the lower polycrystalline silicon film 503 and the gate oxide film 102 is suppressed. Therefore, the secondary problem with the conventional method of manufacturing a Bi-CMOS device, that is, a reduction in the life of the gate oxide film resulting from the segregation of an impurity such as arsenic around the interface between the lower polycrystalline silicon film 503 and the gate oxide film 102, can be suppressed. Further, because nitrogen has not been introduced in the emitter electrode 302, the current amplification factor of the NPN bipolar transistor is not reduced. Thus, a semiconductor device having a higher reliability than the conventional one can be manufactured without reducing original device performance.

The manufacturing method according to the sixth embodiment is summarized as follows. In the sixth embodiment, the manufacturing method of a semiconductor device which has a bipolar transistor and a MOS transistor on the same semiconductor substrate, includes (1) a step of forming, on a first conductive type semiconductor substrate 1, a second conductive type collector layer 3, a second conductive type well layer 5, a first conductive type well layer 6, and an element isolating oxide film 101 surrounding each device formation region, (2) a step of forming a gate oxide film 102 on the surface of each device formation region of said collector layer 3 and both well layers 5 and 6, and then forming a first polycrystalline silicon film 503 on the entire surface, (3) a step of removing the first polycrystalline silicon 503 from a base layer formation region, and forming a first conductive type base layer 9 on the upper portion of the collector layer 3, (4) a step of covering the surface of a region of the base layer 9 other than an emitter layer formation region with an insulating film 104 and 106, (5) a step of forming an amorphous silicon film 510 on the exposed surface of said emitter layer formation region of the base layer 9 and on the surface of the first polycrystalline silicon film 503, and covering an emitter electrode formation region of the second polycrystalline silicon film 510 with a protective film 800, (6) a step of ion-implanting nitrogen into the amorphous silicon film 510 with the said protective layer 800 as a mask, (7) a step of ion-implanting a second conductive type impurity into the entire surface of the amorphous silicon film 510 after removal of said protective film 800, (8) a step of forming an emitter electrode 302, consisting of the amorphous silicon film 510 on the emitter layer formation region of the base layer 9 extending onto the insulating film 106 and 104, and also forming each gate electrode 403 and 404, consisting of the first polycrystalline silicon film 503 and the amorphous silicon film 210 on the gate oxide film 102 on the second and first conductive type well layers 5 and 6, respectively, by patterning the amorphous silicon film 510 and the first polycrystalline silicon film 503, (9) a step of diffusing the second conductive type impurity from said emitter electrode 302 into the upper portion of the base layer 9 to form an emitter layer 10, diffusing the second conductive type impurity and nitrogen at the same time from said amorphous silicon film 510 into the first polycrystalline silicon film 503 of the gate electrode 403 and 404, and aggregating the nitrogen around the interface between the first polycrystalline silicon film 503 and the gate oxide film 102, by thermal treatment, and simultaneously crystallizing the amorphous silicon film 510 of the emitter electrode 302 and of the gate electrodes 403 and 404 to transform into a second polycrystalline silicon film 302 and 504, and (10) a step of forming a first conductive type source/drain layer 11 in the upper portion of the second conductive type well layer 5, except of a portion just under the gate electrode 403, and also forming a second conductive type source/drain layer 12 in the upper portion of the first conductive type well layer 6, except a portion just under the gate electrode 404.

Further, the protective film 800 is preferably a photoresist film formed by photolithography.

Seventh embodiment

Figure 18:
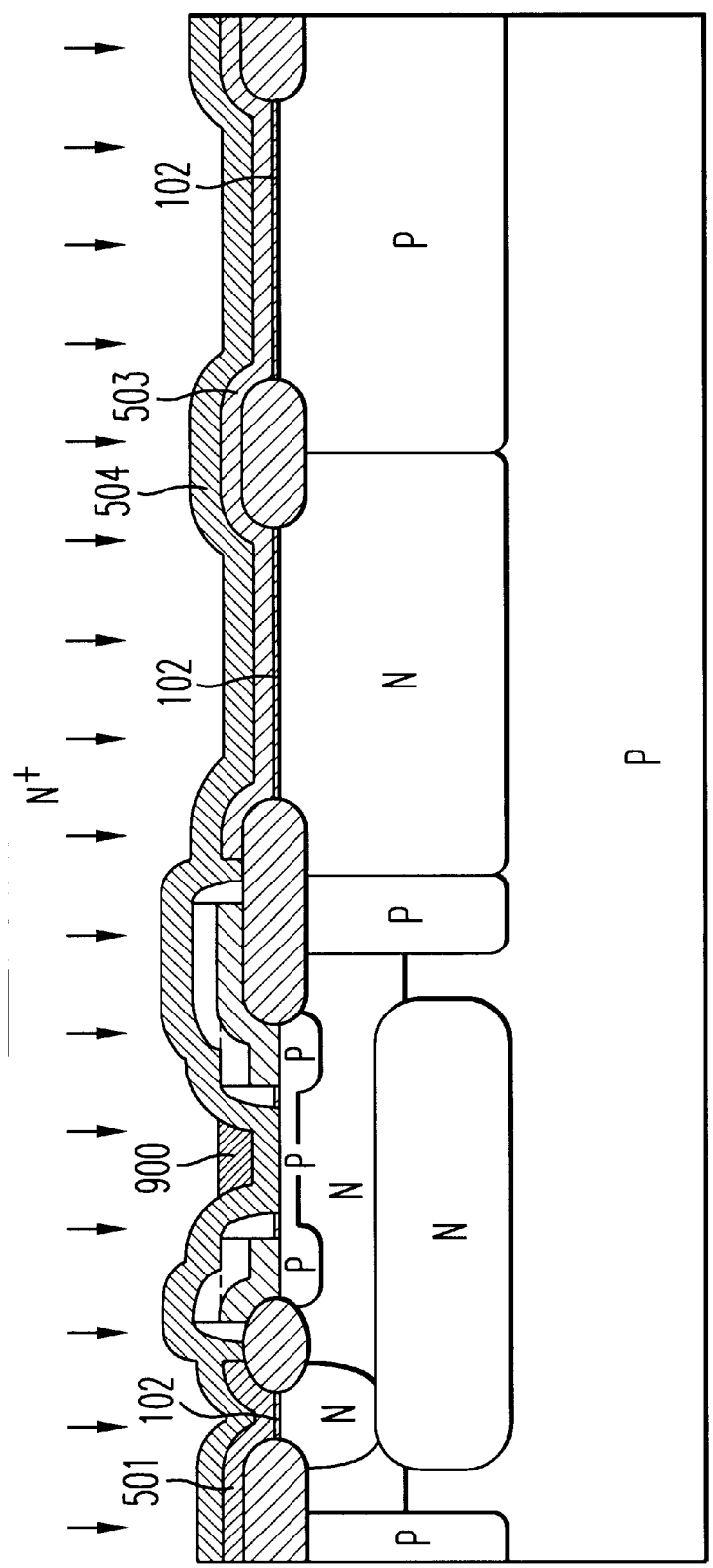
FIG. 18 is a cross-sectional structural view showing a manufacturing method (fifth manufacturing method) of a Bi-CMOS device according to a seventh embodiment of the present invention.

FIG. 18 is a cross-sectional structural view showing a manufacturing method (fifth manufacturing method) of a Bi-CMOS device according to a seventh embodiment of the present invention.

In the manufacturing method of the seventh embodiment, the same step shown in FIG. 5 in the third embodiment is performed first. Next, the same step shown in FIG. 14 in the fifth embodiment is performed. Then, the steps described with reference to FIGS. 7 through 9 in the third embodiment are performed.

Thereafter, as shown in FIG. 18, an upper polycrystalline silicon film 504 of film thickness 100 nm, for example, is formed on the entire surface. Then, a compound of $S_i(OH)_4$ or the like, dissolved in an organic solvent, is spin-coated and baked on the upper polycrystalline silicon film 504, and the recess portion of the emitter electrode formation region of the bipolar transistor is covered with the coated film 900. With this film 900 as a mask, nitrogen ions are implanted into the upper polycrystalline silicon film 504. In this process, the ion implantation conditions are set so that nitrogen ions do not reach the gate oxide film 102. In the case of the seventh embodiment, an implantation energy of 15 KeV and an implantation dose of $7.5E15/cm^2$ are suitable. Thus, in the upper polycrystalline silicon film 504, an amorphous silicon layer is formed at a depth near the projected range of the nitrogen ions.

Thereafter, the coated film 900 is removed, and arsenic ions are implanted into the entire surface of the upper polycrystalline silicon film 504. In this process, the implantation energy of arsenic ions is set so that the projected range of arsenic ions is shallower than the amorphous layer formed in the upper polycrystalline silicon layer 504, shown in the step of FIG. 18. In the case of this embodiment it is suitable that the implantation energy is less than 50 KeV. The concentration distribution of arsenic and nitrogen immediately after arsenic ion implantation is the same as that shown in FIG. 16 of the fifth embodiment.

Thereafter, as with the fifth embodiment, the emitter electrode 302, consisting of the upper polycrystalline silicon film 504 and the gate electrodes 403 and 404, consisting of the lower polycrystalline silicon film 503 and the upper polycrystalline silicon film 504 containing nitrogen, are formed. Further, by thermal treatment, the N-type emitter layer 10 is formed, the lower polycrystalline silicon film 503 is changed to an N-type, and nitrogen is aggregated near the interface between the lower polycrystalline silicon film 503 and the gate oxide film 102. Then, the same step described with reference to FIG. 12 in the third embodiment is performed, and the Bi-cMos device as shown in FIG. 1 of the first embodiment is obtained.

According to the seventh embodiment as described above, in the step of FIG. 18, the coated film 900 is employed as a mask when nitrogen ions are introduced into the region other than the emitter electrode formation region of the upper polycrystalline silicon film 504. Therefore, in addition to the advantageous effects of the fifth embodiment, further advantage is attained, in that it is not necessary to make a photomask for patterning a photoresist film. Thus, an increase in the manufacturing cost is suppressed.

To summarize briefly, the seventh embodiment is characterized in that the protective film 800, used in the manufacturing method according to the fifth embodiment, is replaced by the coated film 900 formed in the recess of the upper polycrystalline silicon film 504.

Eighth embodiment

Figure 19:
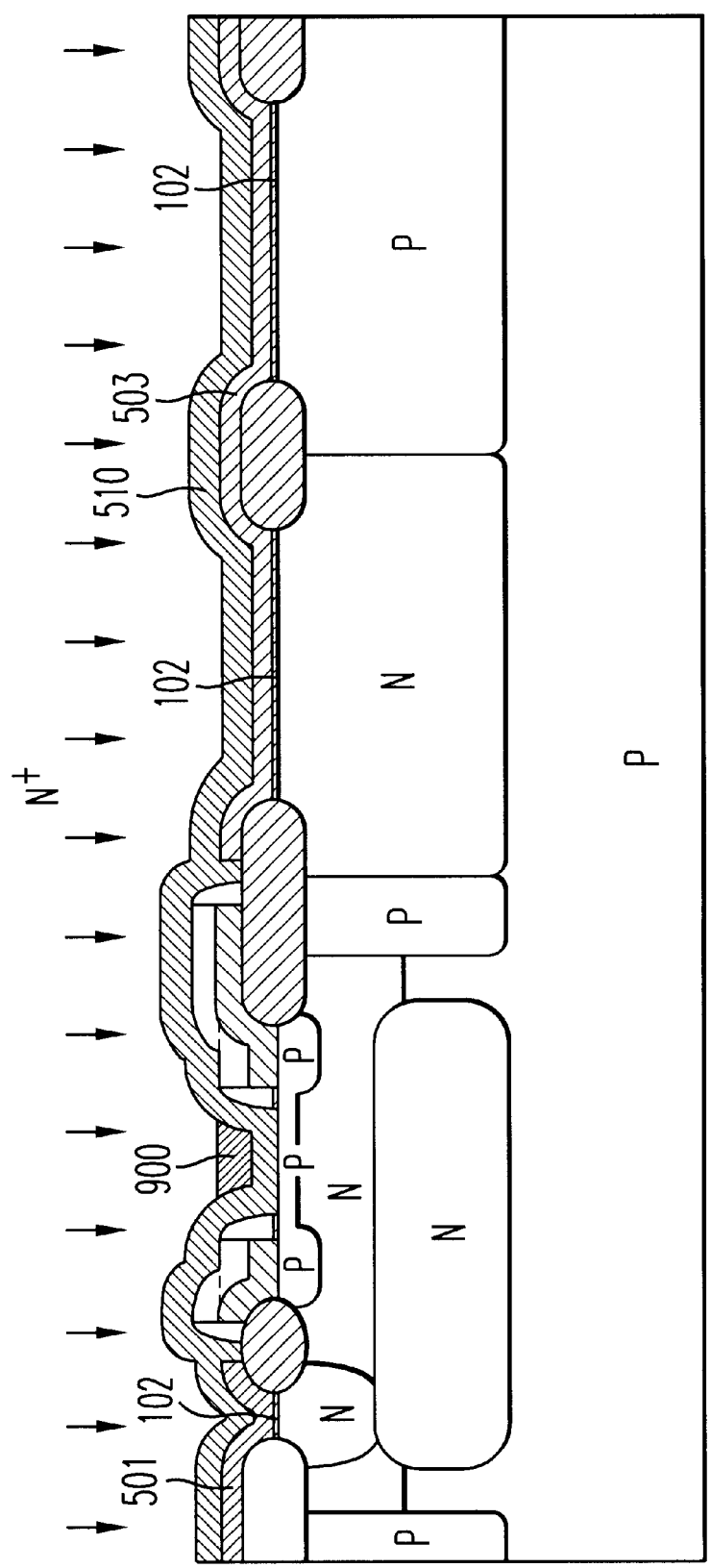
FIG. 19 is a cross-sectional structural view showing a manufacturing method (sixth manufacturing method) of a Bi-CMOS device according to an eighth embodiment of the present invention.

FIG. 19 is a cross-sectional structural view showing a manufacturing method (sixth manufacturing method) of a Bi-CMOS device according to an eighth embodiment of the present invention.

In the manufacturing method of the eighth embodiment, the same step as explained with reference to FIG. 5 in the manufacturing method of the third embodiment is performed first. Next, the same step as shown in FIG. 14 of the manufacturing method of the fifth embodiment is performed. Then, the same steps as those described with reference to FIGS. 7 through 9 in the manufacturing method of the third embodiment are performed.

Thereafter, as shown in FIG. 19, an amorphous silicon film 510 of film thickness 100 nm, for example, is formed on the entire surface. A compound of $Si(OH)_4$ or the like dissolved in an organic solvent is spin-coated and baked on the amorphous silicon film 510, thereby a coated film 900 is formed in the recess portion of the amorphous silicon film 510 on the emitter electrode formation region of the bipolar transistor. With this film 900 as a mask, nitrogen ions are implanted into the amorphous silicon film 510. In this process, the ion implantation conditions are set so that nitrogen ions do not reach the gate oxide film 102. In the case of the seventh embodiment, an implantation energy of 15 KeV and an implantation dose of $7.5E15/cm^2$ are suitable.

Thereafter, the coated film 900 is removed, and arsenic ions are implanted into the entire surface of the amorphous silicon film 510. At this time, the ion implantation conditions are set so that nitrogen ions do not reach the gate oxide film 102. In the case of this embodiment, an implantation energy of 50 KeV and an implantation dose of $7.5E15/cm^2$ are suitable.

Thereafter, as with the sixth embodiment, the emitter electrode 302, consisting of an amorphous silicon film 510 and the gate electrodes 403 and 404, consisting of the lower polycrystalline silicon film 503 and the amorphous silicon film 504 containing nitrogen, are formed. Further, by thermal treatment, the N-type emitter layer 10 is formed, and the lower polycrystalline silicon film 503 is turned to an N-type, and nitrogen is aggregated around the interface between the lower polycrystalline silicon film 503 and the gate oxide film 102. Then, the same step described with reference to FIG. 12 in the third embodiment is performed, and the Bi-CMOS device as shown in FIG. 1 of the first embodiment is obtained.

According to the eighth embodiment as described above, the coated film 900 is employed as a mask when nitrogen ions are introduced into the region other than the emitter electrode formation region of the amorphous silicon film 510 in the step of FIG. 19. Therefore, in addition to the advantageous effects of the sixth embodiment, a further advantage is that a photomask for exposing a photoresist is not needed. Therefore, an increase in the manufacturing cost is suppressed.

To summarize briefly, the eighth embodiment is characterized in that the protective film 800, used in the manufacturing method according to the sixth embodiment, is replaced by the coated film 900 formed on the amorphous silicon film 504.

Ninth embodiment

Figure 20:
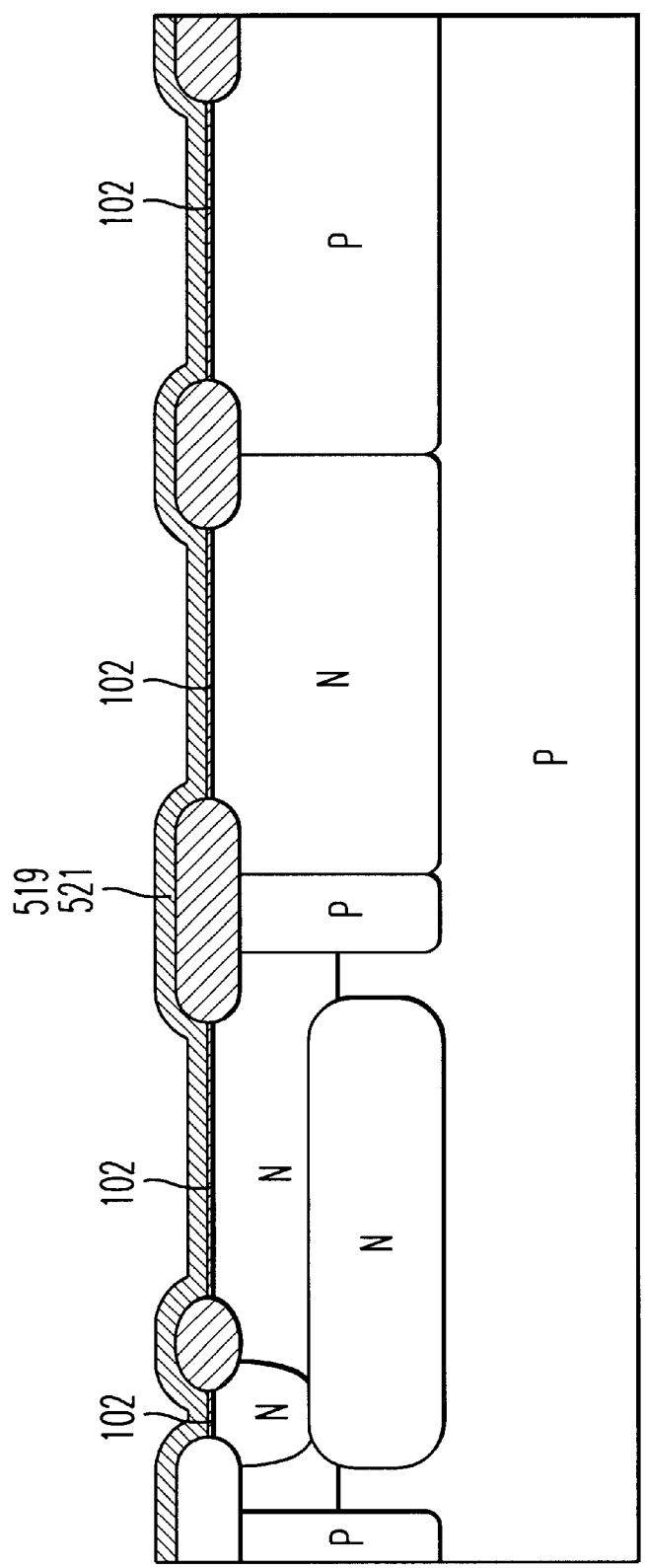
FIGS. 20 through 22 are cross-sectional structural views showing a manufacturing method (seventh manufacturing method) of a Bi-CMOS device according to a ninth embodiment of the present invention.
Figure 21:
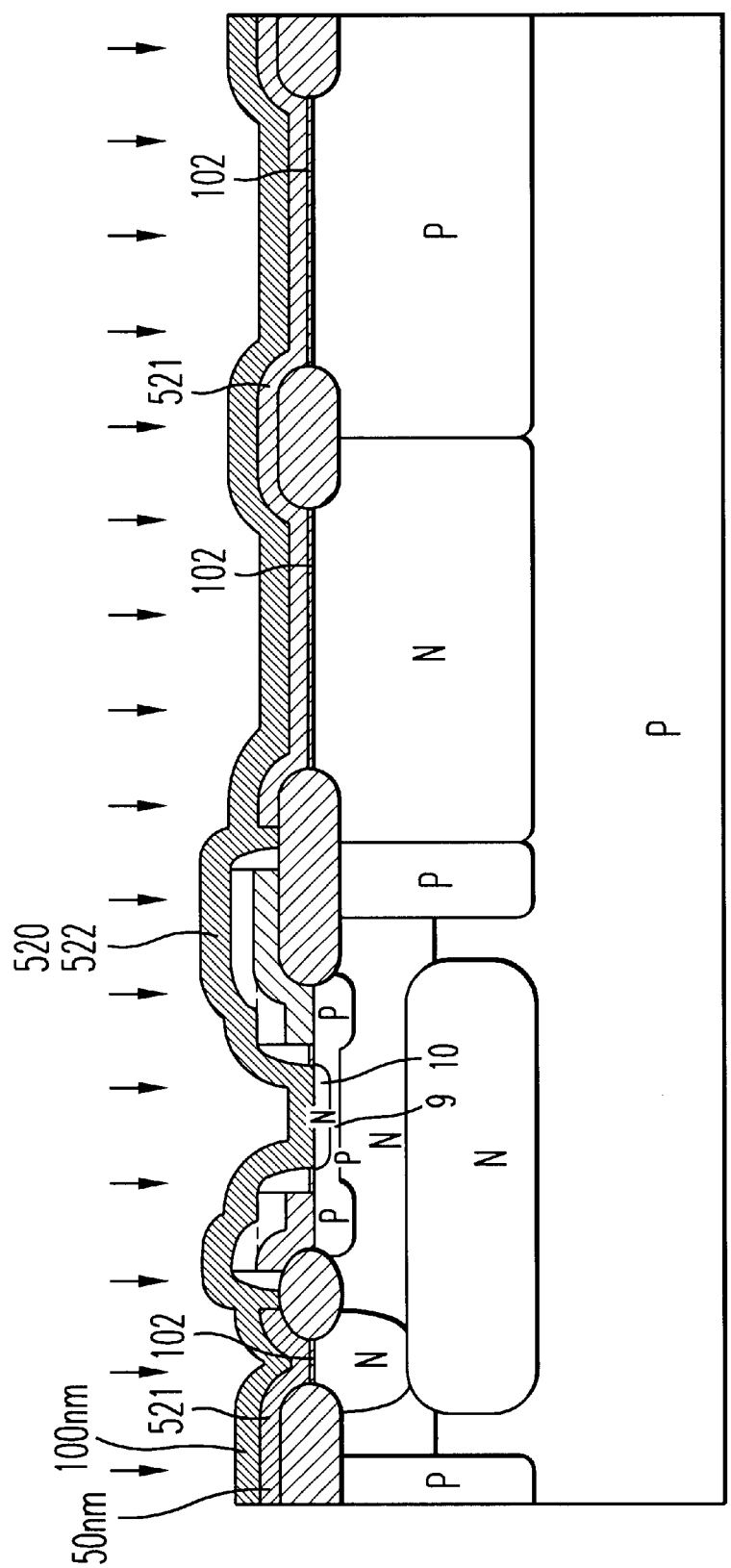
Figure 22:
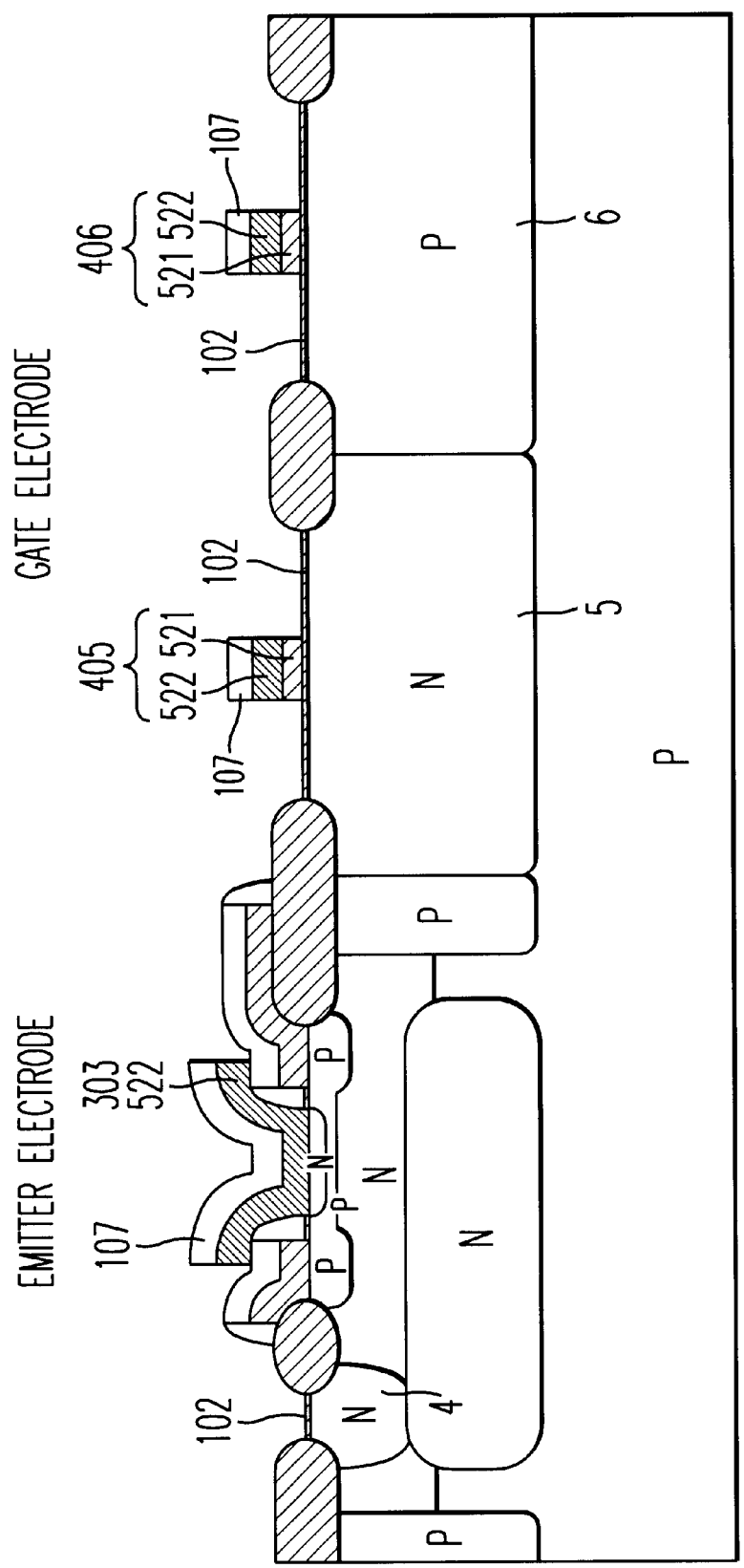

A ninth embodiment of the present invention relates to a method for manufacturing the Bi-CMOS device described in the second embodiment of the present invention. FIGS. 20 through 22 are cross-sectional structural views showing a 20 manufacturing method (seventh manufacturing method) of a Bi-CMOS device according to a ninth embodiment of the present invention.

In the manufacturing method in the ninth embodiment, the same step as explained with reference to FIG. 5 of the manufacturing method in the third embodiment is performed first. Thereafter, as shown in FIG. 20, a gate oxide film 102 of film thickness 10 nm, for example, is formed on each surface of the N-type collector layer 3, the N-type collector contact layer 4, the N-type well layer 5, and the P-type well layer 6. Further, an amorphous silicon film 519 of 50 nm, for example, is formed on the entire surface of the gate oxide film 102. Then, the amorphous silicon film 519 comes to be crystallized by thermal treatment at about 850° C., and is transformed into a lower monocrystalline silicon film 521.

Thereafter, the same steps as those described with reference to FIGS. 7 through 9 in the third embodiment are performed. However, the lower polycrystalline silicon film 503 is being replaced with the lower monocrystalline silicon film 521.

Thereafter, as shown in FIG. 21, an amorphous silicon film 520 of film thickness 100 nm, for example, is formed on the entire surface, and nitrogen ions are implanted into the amorphous silicon film 520. In this process, the ion implantation conditions are set so that nitrogen ions do not reach the gate oxide film 102. In the case of the ninth embodiment, an implantation energy of 50 KeV and an implantation dose of 7.5E15/cm$^2$ are suitable.

Further, by a thermal treatment at about 850° C., arsenic is thermally diffused from the amorphous silicon film 520 into the upper portion of the P-type base layer 9 to form a heavily doped N-type emitter layer 10. At the same time, arsenic is also diffused from the amorphous silicon film 520 into the lower monocrystalline silicon film 521, so that it becomes an N-type. In addition, the amorphous silicon film 520 is oriented and crystallized in accordance with the crystal orientation of the lower monocrystalline silicon film 521, and transformed into an upper monocrystalline silicon film 522.

Next, referring to FIG. 22, an oxide film 107 is deposited over the entire surface. Then, the oxide film 107, the upper monocrystalline silicon film 522, and the lower monocrystalline silicon film 521 are sequentially removed, while those films on the emitter electrode formation region of the bipolar transistor and on the gate electrode formation region of the MOS transistor are not removed. With this, the emitter electrode 303, consisting of the upper monocrystalline silicon film 522, and the gate electrodes 405 and 406, consisting of the lower monocrystalline silicon film 521 and the upper monocrystalline silicon film 522, are formed. During this process, the gate oxide film 102 serves as a protective film for each surface of the N-type collector contact layer 4, the N-type well layer 5, and the P-type well layer 6. In addition, because the lower monocrystalline silicon film 521 and the upper monocrystalline silicon film 522 of the gate electrodes 405 and 406 are in the same crystal orientation, they are in the state as a monocrystalline silicon film.

Thereafter, the same step as that described with reference to FIG. 12 in the third embodiment is performed, and the Bi-CMOS device shown in FIG. 4 of the second embodiment is obtained.

In the ninth embodiment as described above, arsenic ions have been implanted as N-type impurities into the amorphous silicon film 520 in the step of FIG. 21. However, an N-type dopant other than arsenic, such as phosphorus, may be used.

According to the ninth embodiment, in the step of FIG. 21, the amorphous silicon film 520 is formed as the emitter electrode and as the overlying film of the gate electrodes 405 and 406, and arsenic ions are implanted into the amorphous silicon film 520. Therefore, the first problem with the conventional manufacturing method of a Bi-CMOS device, that is, the deterioration in the quality of the gate oxide film 102 caused by the channeling phenomenon of arsenic ions, is not induced.

Furthermore, according to the ninth embodiment, in the step of FIG. 20, the amorphous silicon film 519 is formed as the underlying layer of the gate electrodes 405 and 406. Then, the film 519 is crystallized by a thermal treatment so that it becomes the lower monocrystalline silicon film 521. Therefore, high-speed diffusion of arsenic ions along the, grain boundary is eliminated, when the lower monocrystalline silicon film 521 is changed to an N-type by diffusing arsenic ions from the amorphous silicon film 520, containing arsenic ions, into the lower monocrystalline silicon film 521 in the process of FIG. 21. Therefore, the secondary problem with the conventional manufacturing method of a Bi-CMOS device, that is, a reduction in the life of the gate oxide film resulting from the segregation of arsenic around the interface between the lower monocrystalline silicon film 521 and the gate oxide film 102, can be suppressed.

In addition, because the emitter electrode 303 and the gate electrodes 405 and 406 are all formed with a monocrystalline silicon film, the electric resistance of each electrode becomes low. Consequently, there is an advantageous effect that a Bi-CMOS device of a high reliability can be manufactured with less loss of consumption power than the conventional Bi-CMOS device, and with high-speed operation.

The manufacturing method according to the ninth embodiment is summarized as follows. According to the ninth embodiment, a method of manufacturing a semiconductor device, which has a bipolar transistor and a MOS transistor on the same semiconductor substrate, includes (1) a step of forming on a first conductive type semiconductor substrate 1 a second conductive type collector layer 3, a second conductive type well layer 5, a first conductive type well layer 6, and an element isolating oxide film 101 surrounding each device formation region, (2) a step of forming a gate oxide film 102 on the surface of each device formation region of said collector layer 3 and both well layers 5 and 6, then forming a first amorphous silicon film 519 on the entire surface, and crystallizing the first amorphous silicon film 519 by thermal treatment so that it becomes a first monocrystalline silicon film 521, (3) a step of removing the first monocrystalline silicon 521 on a base layer formation region, and forming a first conductive type base layer 9 on the upper portion of the collector layer 3, (4) a step of covering the surface of a region other than an emitter layer formation region in said base layer 9 with an insulating film 104 and 106, (5) a step of forming a second amorphous silicon film 520 on the exposed surface of said emitter layer formation region of the base layer 3 and the surface of the first monocrystalline silicon film 521, (6) a step of ion-implanting a second conductive type impurity into the second amorphous silicon film 520, (7) a step of diffusing, by thermal treatment, the second conductive type impurity from the second amorphous silicon film 520 into the upper portion of the base layer 9 to form-an emitter layer 10, and simultaneously diffusing the second conductive type impurity from the second amorphous silicon film 520 into the first monocrystalline silicon film 521, and simultaneously crystallizing the second amorphous silicon film 520 so that it becomes a second monocrystalline silicon film 522, (8) a step of forming an emitter electrode 303 consisting of the second monocrystalline silicon film 522 at a position on said emitter layer 10 extending onto said insulating film 106 and 104, and also forming a gate electrode consisting of the first monocrystalline silicon film 521 and the second monocrystalline silicon film 522 on the gate oxide film 102 on said second and first conductive type well layers 5 and 6, by patterning said second single monocrystalline silicon film 522 and said first monocrystalline silicon film 521, and (9) a step of forming a first conductive type source/drain layer 11 on the upper portion of the second conductive type well layer 5, except a portion just under the gate electrode 403, and also forming a second conductive type source/drain layer 12 on the upper portion of the first conductive type well layer 6, except a portion just under the gate electrode 404.

As has been described above in detail, according to the present invention, a semiconductor device, having a bipolar transistor and a MOS transistor on the same semiconductor substrate, and a manufacturing method thereof, can be obtained which is capable of preventing a deterioration in the film quality of a gate oxide film and preventing a reduction in the life of the gate oxide film. With this, the reliability of device operation is enhanced, the loss of consumption power in the device is reduced, and the operating speed is enhanced.

Obviously, numerous additional modifications and variations of the present invention are possible in light of the above teachings. It is therefore to be understood that within the scope of the appended claims, the invention may be practiced otherwise than as specifically described herein.

What is claimed is:

1. A semiconductor device, comprising:
    at least one bipolar transistor; and
    at least one metal-oxide semiconductor (MOS) transistor on a semiconductor substrate,
    said at least one MOS transistor including a gate oxide film and a gate electrode, said gate electrode being comprised of a first electrode layer and a second electrode layer formed on said first electrode layer, said first electrode layer being in contact with said gate oxide film and containing nitrogen selectively introduced into the gate electrode, a majority of the nitrogen being aggregated at an interface with said gate oxide film and portions of the nitrogen other than the majority being disposed at both sides of the interface with the gate oxide film; and
    said at least one bipolar transistor including a nitrogen-free emitter electrode having a same film thickness as a thickness of said second gate electrode layer of said at least one MOS transistor.

2. The semiconductor device as set forth in claim 1, further comprising:
    a high-melting-point metal film or a silicide film of a high-melting-point metal on said gate electrode of said at least one MOS transistor and on said emitter electrode of said at least one bipolar transistor.

3. The semiconductor device as set forth in claim 1, wherein:
    said at least one bipolar transistor is an NPN type having an N-type emitter electrode, and
    said at least one MOS transistor includes a plurality of MOS transistors which are complementary metal-oxide semiconductor (CMOS) transistors of a P-channel MOS type having an N-type gate electrode and an N-channel MOS type having an N-type gate electrode.

4. A semiconductor device, comprising:
    at least one metal-oxide semiconductor (MOS) transistor on a semiconductor substrate, said at least one MOS transistor including a gate electrode being comprised of a first electrode layer and a second electrode layer formed on the first electrode layer, said first and second electrode layers having a same crystal orientation so as to form a first monocrystalline silicon film; and
    at least one bipolar transistor including an emitter electrode formed of a second monocrystalline silicon film thinner than said first monocrystalline silicon film of said gate electrode of said at least one MOS transistor, said second monocrystalline silicon film being formed by thermal treatment from an amorphous silicon film such that an oxide film remains at a boundary of the emitter electrode and an emitter layer formed in the semiconductor substrate.

5. The semiconductor device as set forth in claim 4, further comprising:
    a high-melting-point metal film or a silicide film of a high-melting-point metal on said gate electrode of said at least one MOS transistor and on said emitter electrode of said at least one bipolar transistor.

6. The semiconductor device as set forth in claim 4, wherein:
    said at least one bipolar transistor is an NPN type having an N-type emitter electrode, and
    said at least one MOS transistor includes a plurality of MOS transistors which include complementary metal-oxide semiconductor (CMOS) transistors having a P-channel MOS type having an N-type gate electrode and an N-channel MOS type having an N-type gate electrode.

7. The semiconductor device as set forth in claim 4, wherein:
    said at least one bipolar transistor is an NPN type having an N-type emitter electrode, and
    said at least one MOS transistor includes a plurality of MOS transistors which include complementary metal-oxide semiconductor (CMOS) transistors having a P-channel MOS type having a P-type gate electrode and an N-channel MOS type having an N-type gate electrode.

8. The semiconductor device as set forth in claim 4, wherein:
    said at least one bipolar transistor includes a plurality of bipolar transistors which are an NPN type having an N-type emitter electrode and an PNP type having a P-type emitter electrode.

9. A semiconductor device, comprising:
    at least one bipolar transistor; and
    at least one metal-oxide semiconductor (MOS) transistor on a semiconductor substrate,
    said at least one MOS transistor including a gate oxide film and a gate electrode, said gate electrode being comprised of a first electrode layer and a second electrode layer formed on said first electrode layer, said first electrode layer being in contact with said gate oxide film and containing nitrogen selectively introduced into the gate electrode, a majority of the nitrogen being aggregated at an interface with said gate oxide film and portions other than the majority being disposed at both sides of the interface with the gate oxide film;
    said at least one bipolar transistor including a nitrogen free emitter electrode having a same film thickness as a thickness of said second gate electrode layer of said at least one MOS transistor;

said at least one bipolar transistor is an NPN type having an N-type emitter electrode; and said at least one MOS transistor includes a plurality of MOS transistors which are complementary metal-oxide semiconductor (CMOS) transistors of a P-channel MOS type having a P-type gate electrode and an N-channel MOS type having an N-type gate electrode.

10. A semiconductor device, comprising:

at least one bipolar transistor; and at least one metal-oxide semiconductor (MOS) transistor on a semiconductor substrate, said at least one MOS transistor including a gate oxide film and a gate electrode, said gate electrode being comprised of a first electrode layer and a second electrode layer formed on said first electrode layer, said first electrode layer being in contact with said gate oxide film and containing nitrogen selectively introduced into the gate electrode, a majority of the nitrogen being aggregated at an interface with said gate oxide film and portions of the nitrogen other than the majority being disposed at both sides of the interface with the gate oxide film;

said at least one bipolar transistor including a nitrogen free emitter electrode having a same film thickness as a thickness of said second gate electrode layer of said at least one MOS transistor; and said at least one bipolar transistor includes a plurality of bipolar transistors which are an NPN type having an N-type emitter electrode and an PNP type having a P-type emitter.

11. A semiconductor device, comprising:

at least one metal-oxide semiconductor (MOS) transistor on a semiconductor substrate, said at least one MOS transistor including a gate electrode being comprised of a first electrode layer and a second electrode layer formed on the first electrode layer, said first and second electrode layers having a same crystal orientation so as to form a first monocrystalline silicon film; and at least one bipolar transistor including an emitter electrode formed of a second monocrystalline silicon film thinner than said first monocrystalline silicon film of said gate electrode of said at least one MOS transistor, said second monocrystalline silicon film being formed by thermal treatment from an amorphous silicon film such that an oxide film remains at a boundary of the emitter electrode and an emitter layer formed in the semiconductor substrate, said at least one bipolar transistor is an NPN type having an N-type emitter electrode; and said at least one MOS transistor includes a plurality of MOS transistors which include complementary metal-oxide semiconductor (CMOS) transistors having a P-channel MOS type having a P-type gate electrode and an N-channel MOS type having an N-type gate electrode.

12. A semiconductor device, comprising:

at least one metal-oxide semiconductor (MOS) transistor on a semiconductor substrate, said at least one MOS transistor including a gate electrode being comprised of a first electrode layer and a second electrode layer formed on the first electrode layer, said first and second electrode layers having a same crystal orientation so as to form a first monocrystalline silicon film; and at least one bipolar transistor including an emitter electrode formed of a second monocrystalline silicon film thinner than said first monocrystalline silicon film of said gate electrode of said at least one MOS transistor, said second monocrystalline silicon film being formed by thermal treatment from an amorphous silicon film such that an oxide film remains at a boundary of the emitter electrode and an emitter layer formed in the semiconductor substrate;

said at least one bipolar transistor includes a plurality of bipolar transistors which are an NPN type having an N-type emitter electrode and an PNP type having a P-type emitter electrode.

13. A semiconductor device, comprising:

at least one bipolar transistor; and at least one metal-oxide semiconductor (MOS) transistor on a semiconductor substrate;

said at least one MOS transistor including a gate oxide film and a gate electrode, said gate electrode being comprised of a first electrode layer and a second electrode layer formed on said first electrode layer, said first electrode layer being in contact with said gate oxide film and containing a dopant inhibitor selectively introduced into the gate electrode, a majority of the dopant inhibitor being aggregated at an interface with said gate oxide film and portions of the dopant inhibitor other than the majority being disposed at both sides of the interface with the gate oxide film; and said at least one bipolar transistor including an emitter electrode free of said dopant inhibitor and having a same film thickness as a thickness of said second gate electrode layer of said at least one MOS transistor.

14. A semiconductor device according to claim 13, wherein said dopant inhibitor comprises nitrogen.

* * * * *